(12) United States Patent
Iida et al.

(10) Patent No.: US 8,980,762 B2
(45) Date of Patent: Mar. 17, 2015

(54) METHOD FOR MANUFACTURING SEMICONDUCTOR DEVICE

(71) Applicants: Kazunori Iida, Mie-Ken (JP); Yuji Kobayashi, Mie-ken (JP)

(72) Inventors: Kazunori Iida, Mie-Ken (JP); Yuji Kobayashi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 272 days.

(21) Appl. No.: 13/728,390

(22) Filed: Dec. 27, 2012

(65) Prior Publication Data

US 2014/0065833 A1 Mar. 6, 2014

Related U.S. Application Data

(60) Provisional application No. 61/695,858, filed on Aug. 31, 2012.

(51) Int. Cl.
| | |
|---|---|
| *H01L 21/44* | (2006.01) |
| *H01L 21/302* | (2006.01) |
| *H01L 21/461* | (2006.01) |
| *H01L 21/308* | (2006.01) |
| *H01L 21/033* | (2006.01) |
| *H01L 21/3213* | (2006.01) |
| *H01L 27/115* | (2006.01) |

(52) U.S. Cl.
CPC ........ *H01L 21/3083* (2013.01); *H01L 21/0337* (2013.01); *H01L 21/0338* (2013.01); *H01L 21/32139* (2013.01); *H01L 27/11519* (2013.01); *H01L 27/11521* (2013.01); *H01L 27/11526* (2013.01); *H01L 27/11565* (2013.01); *H01L 27/11568* (2013.01); *H01L 27/11573* (2013.01)
USPC ........... 438/717; 438/669; 438/671; 438/734; 438/736; 257/E21.017; 257/E21.02; 257/E21.305; 257/E21.53; 257/E21.582

(58) Field of Classification Search
USPC .......................... 438/669, 671, 717, 734, 736; 257/E21.017, E21.02, E21.305, 257/E21.53, E21.582
See application file for complete search history.

(56) References Cited

U.S. PATENT DOCUMENTS

| | | | | |
|---|---|---|---|---|
| 8,618,679 | B2 * | 12/2013 | Sim et al. ...................... | 257/786 |
| 8,759,177 | B2 * | 6/2014 | Yanai et al. ................... | 438/257 |
| 2004/0198019 | A1 | 10/2004 | Yasui et al. | |
| 2006/0035158 | A1 * | 2/2006 | Asano .............................. | 430/5 |
| 2007/0207590 | A1 | 9/2007 | Kiyotoshi et al. | |
| 2008/0206686 | A1 * | 8/2008 | Lee et al. ....................... | 430/323 |
| 2009/0001503 | A1 | 1/2009 | Oh et al. | |
| 2010/0221665 | A1 * | 9/2010 | Hashimoto ................... | 430/312 |
| 2012/0020158 | A1 | 1/2012 | Ozaki et al. | |

FOREIGN PATENT DOCUMENTS

| | | |
|---|---|---|
| JP | 9-228040 | 9/1997 |
| JP | 2001-358061 | 12/2001 |

* cited by examiner

*Primary Examiner* — Mohsen Ahmadi
(74) *Attorney, Agent, or Firm* — Oblon, McClelland, Maier & Neustadt, L.L.P.

(57) ABSTRACT

According to one embodiment, a method for manufacturing a semiconductor device includes forming a film having different filling properties dependent on space width above the patterning film to cover the first line patterns and the second line patterns to form the film on the first line patterns and on the first inter-line pattern space while making a cavity in the first inter-line pattern space and to form the film on at least a bottom portion of the second inter-line pattern space and a side wall of each of the second line patterns. The method includes performing etch-back of the film to remove the film on the first line patterns and on the first inter-line pattern space while causing the film to remain on at least the side wall of the second line patterns.

9 Claims, 20 Drawing Sheets

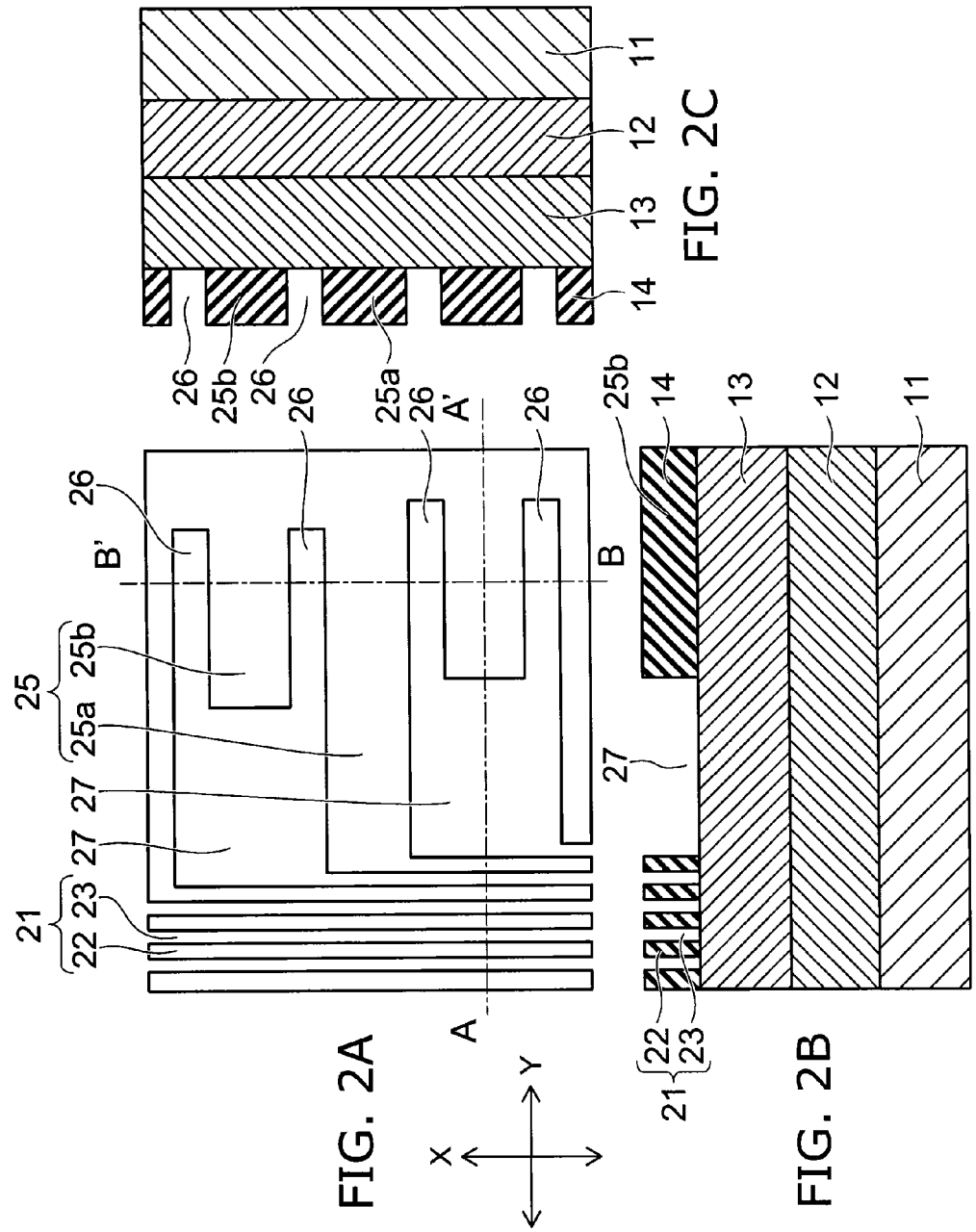

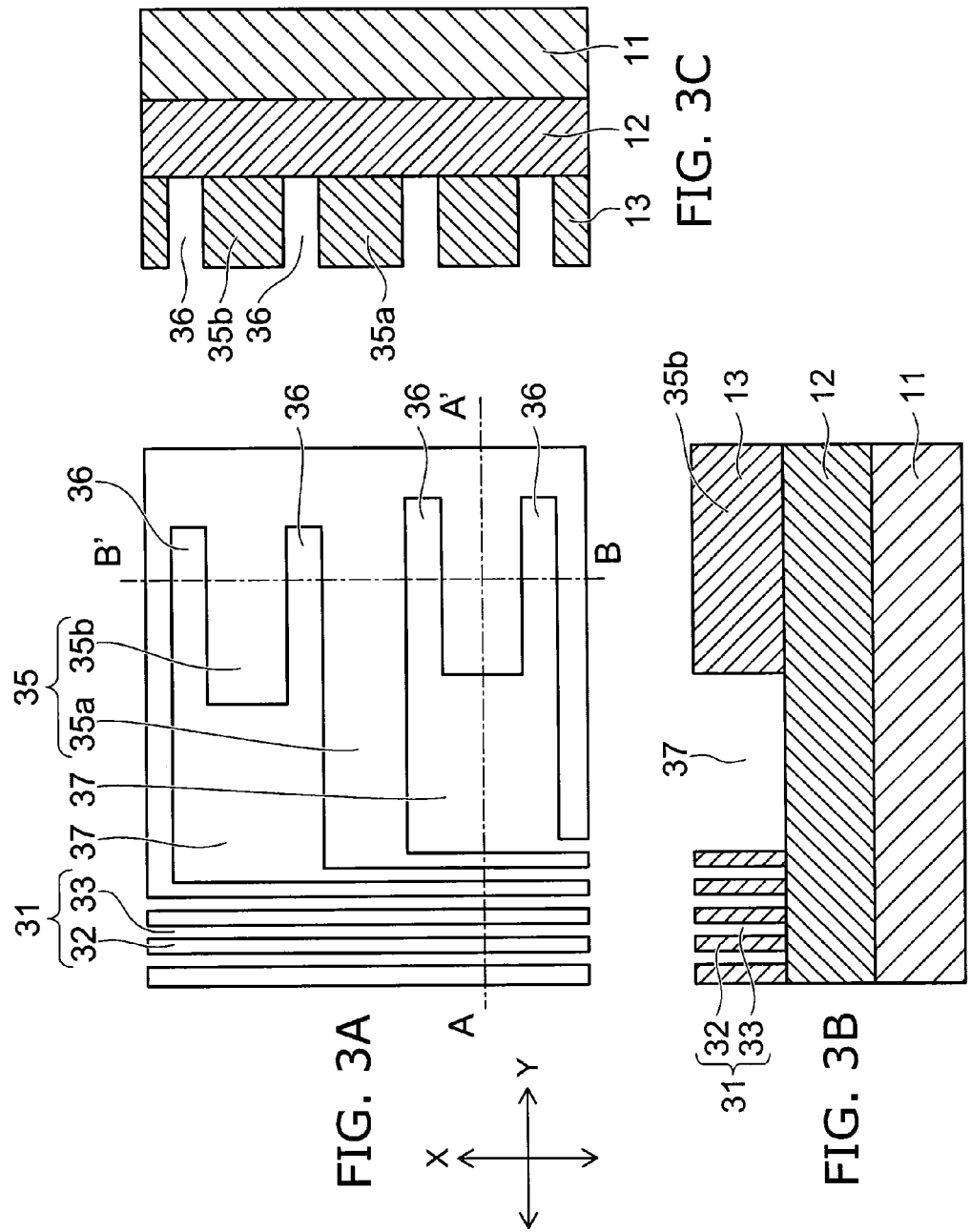

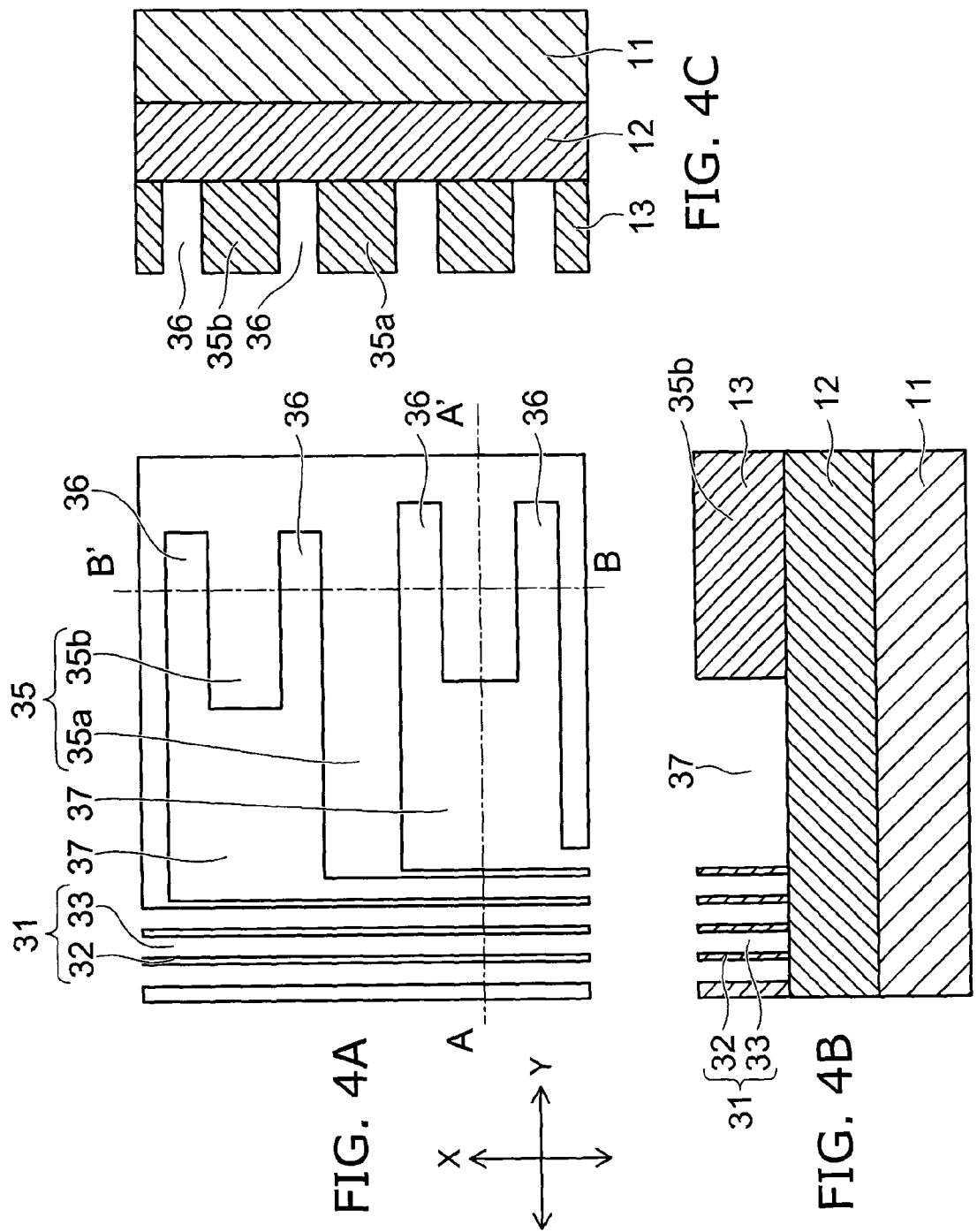

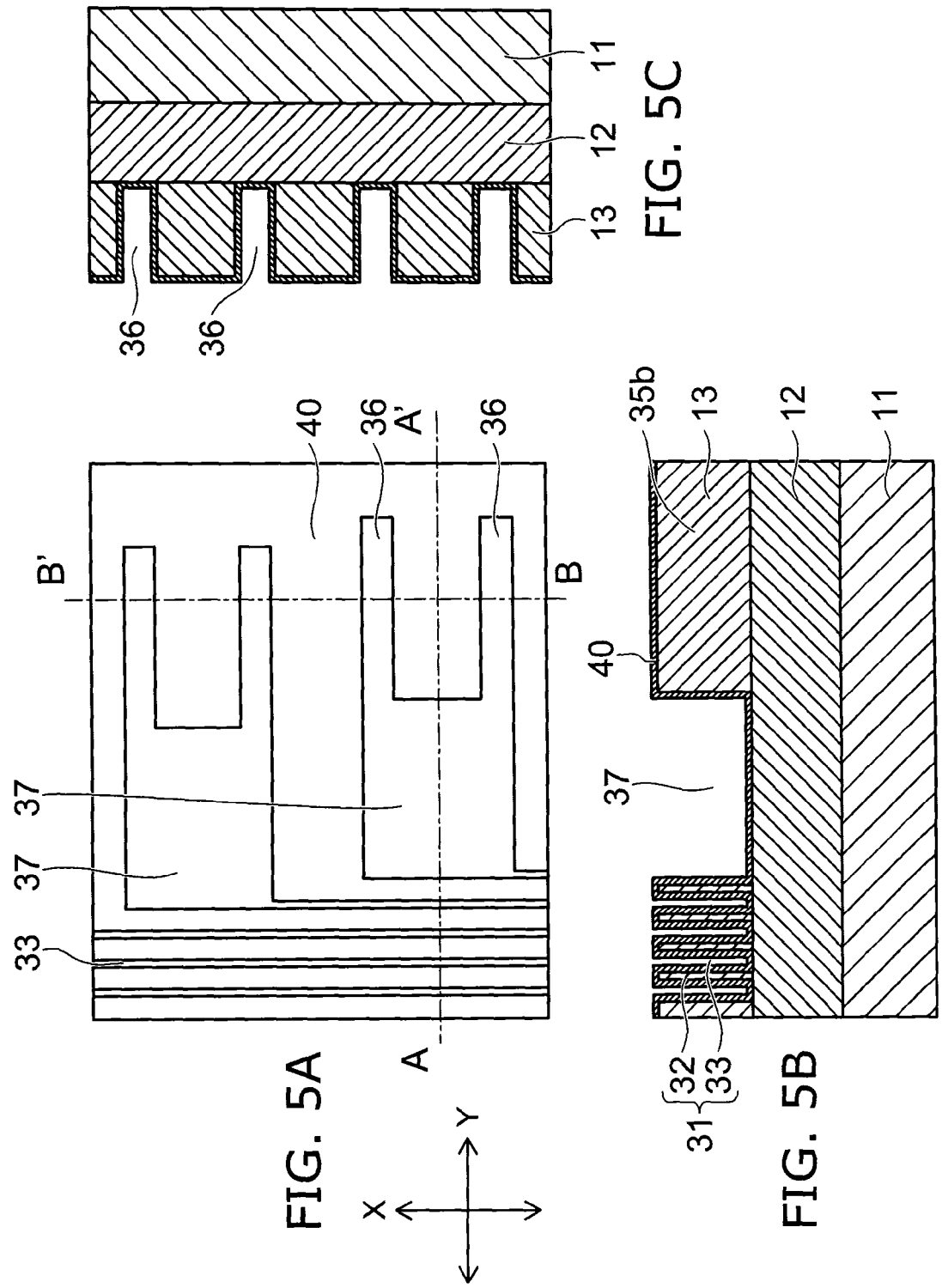

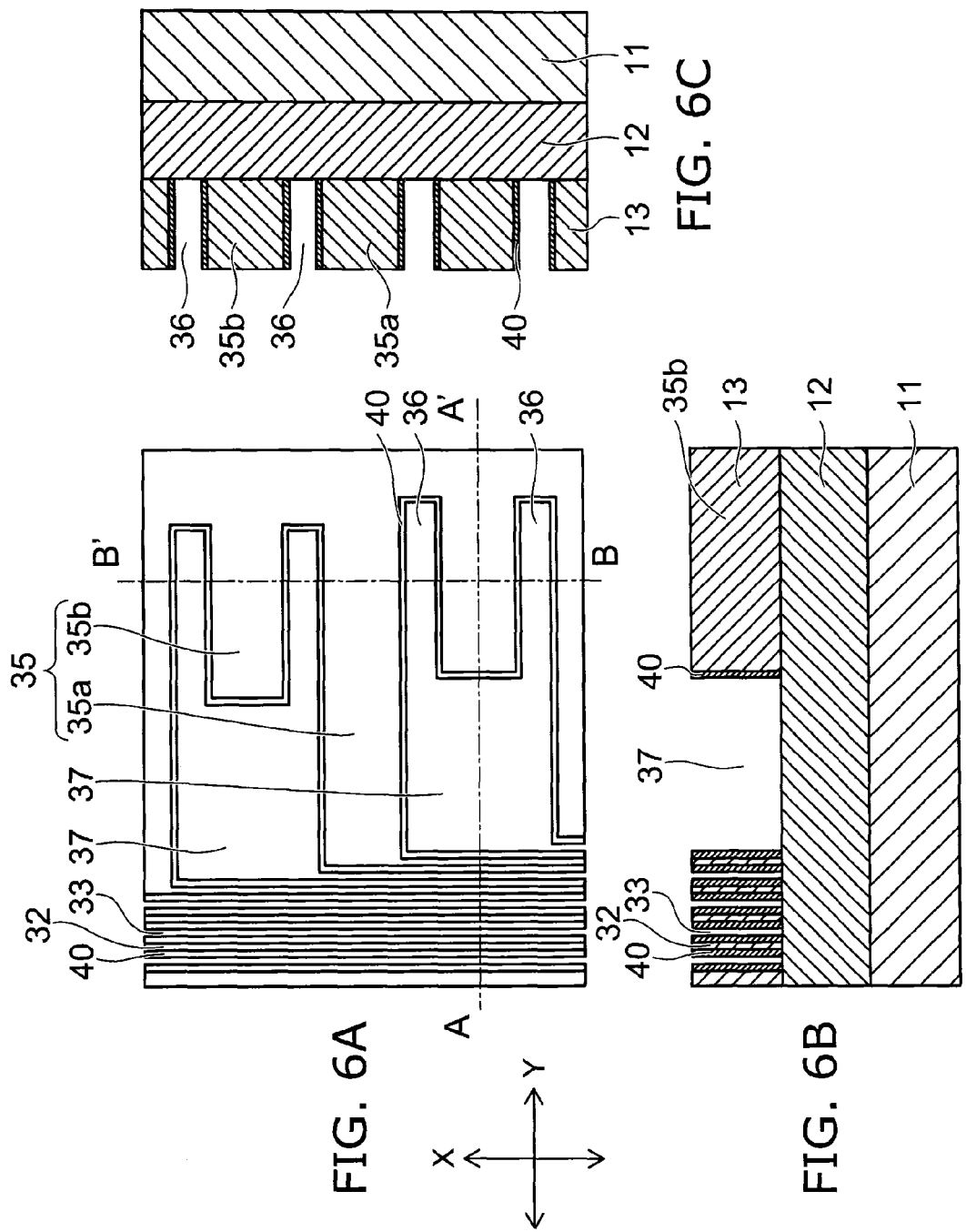

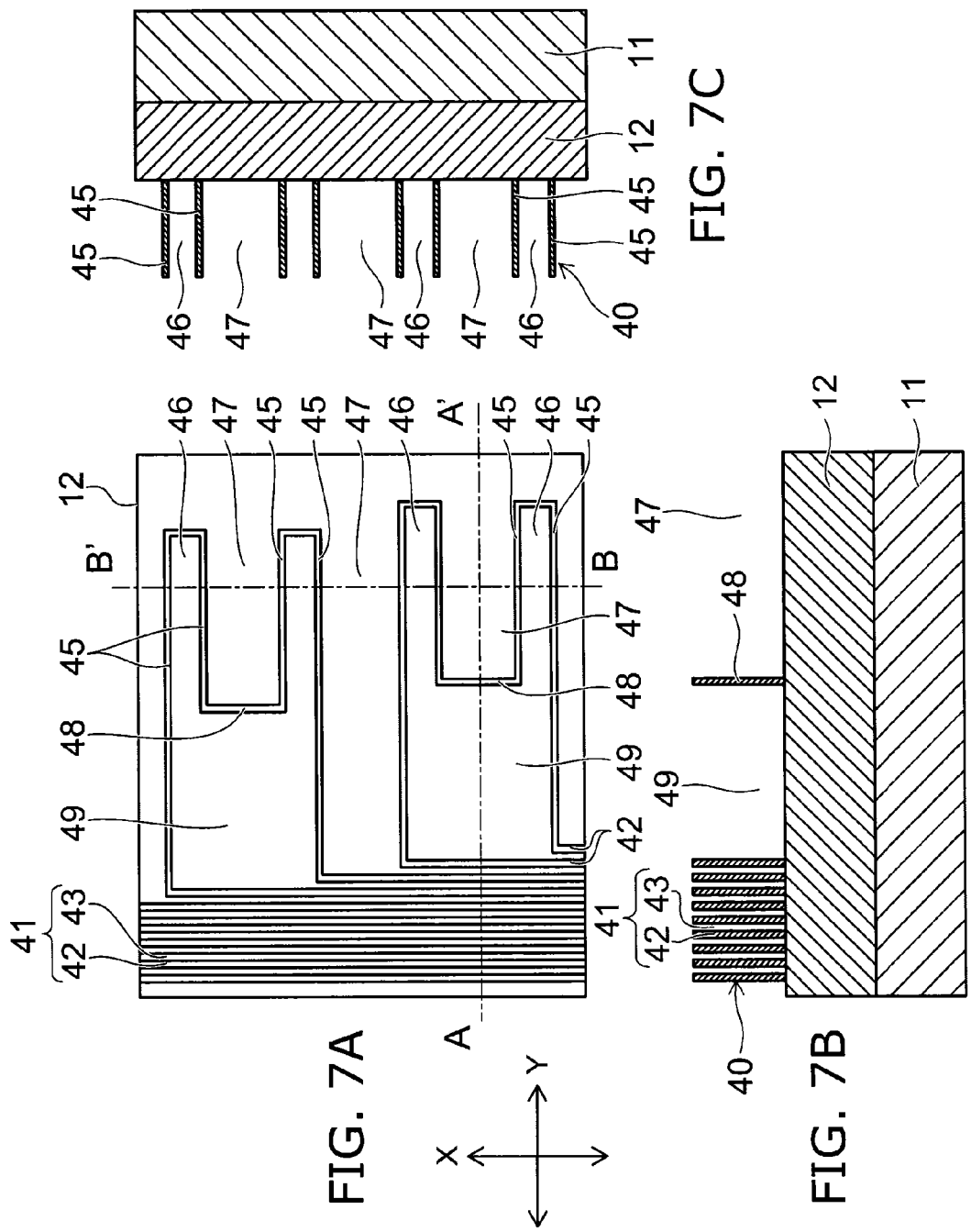

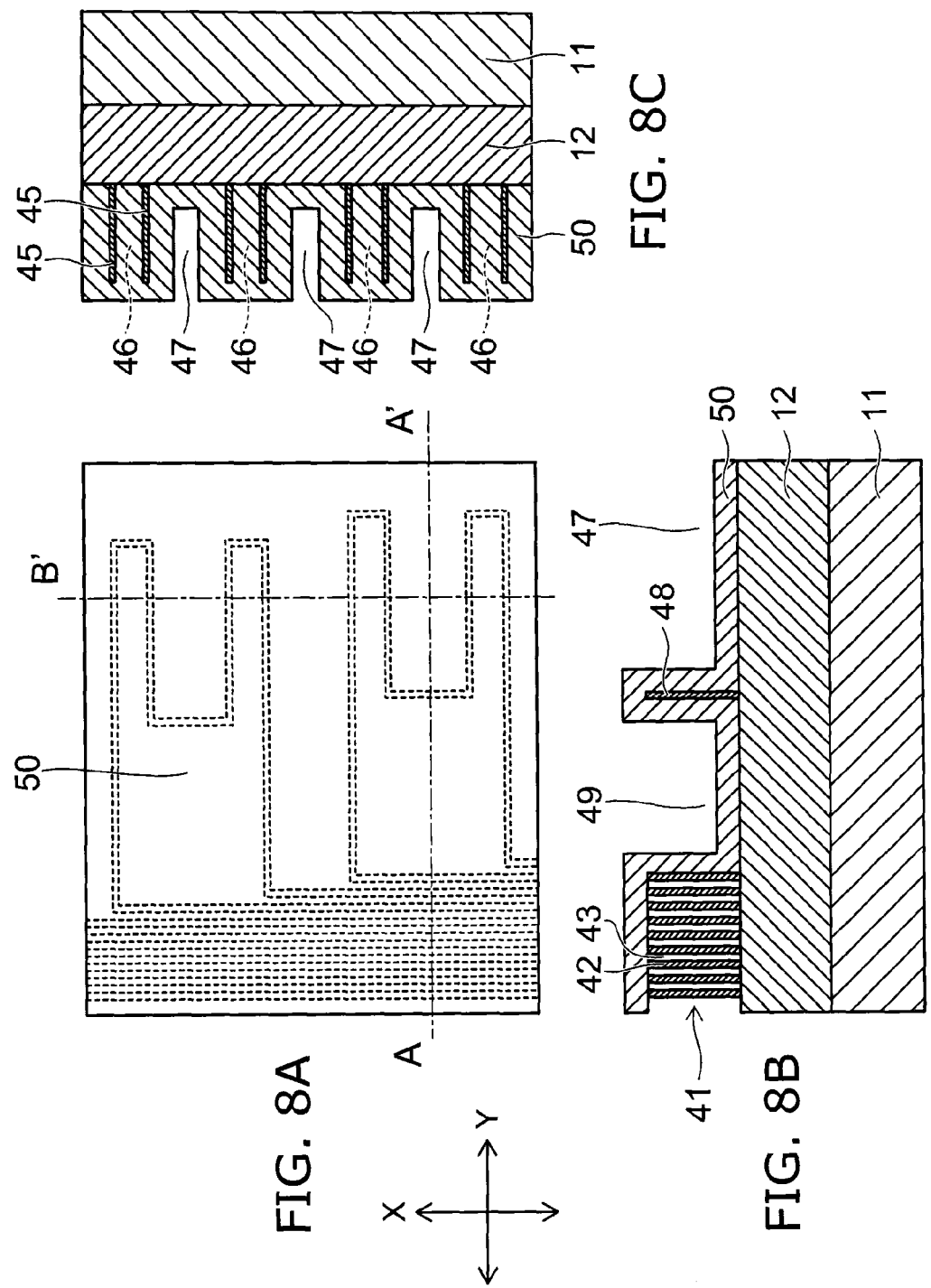

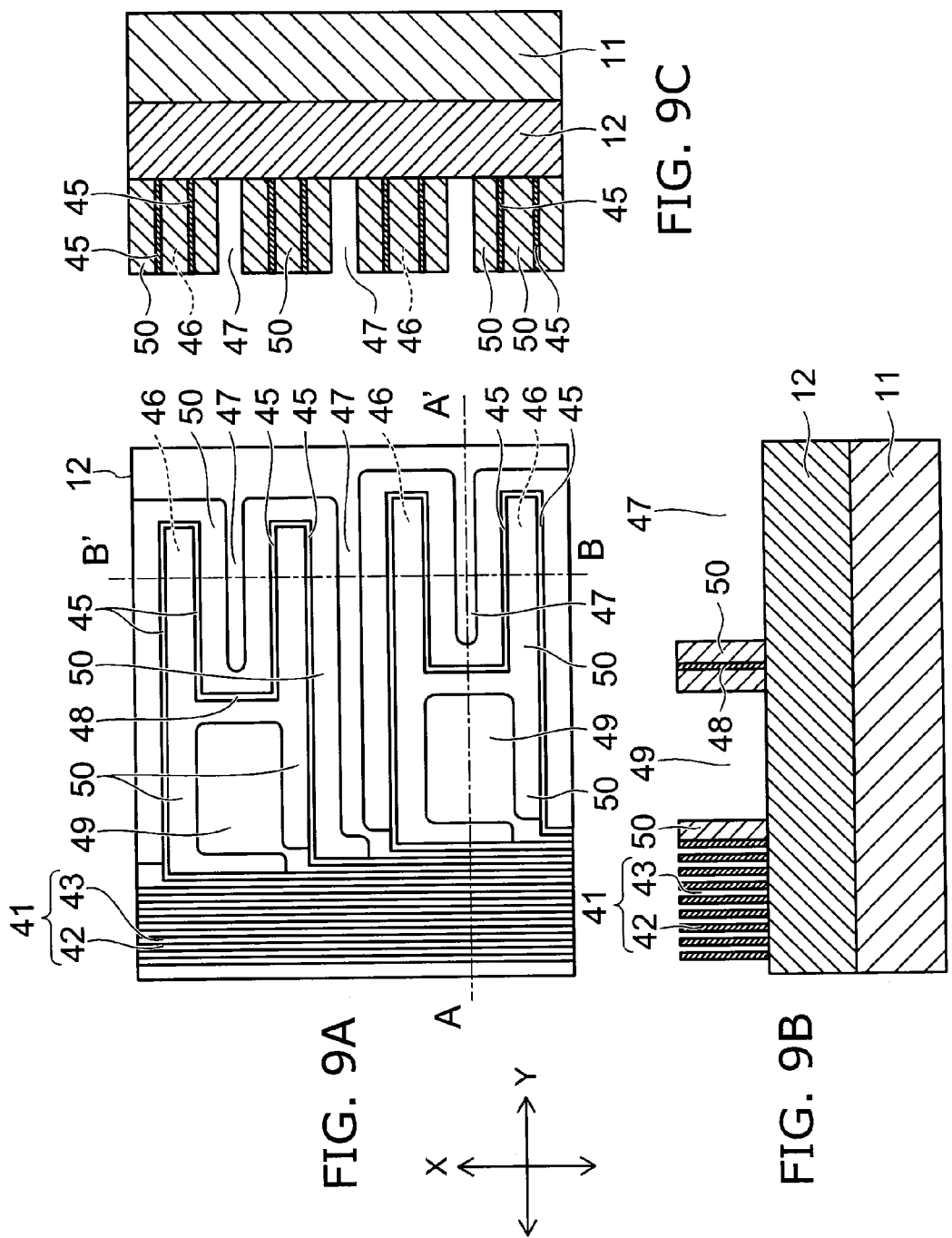

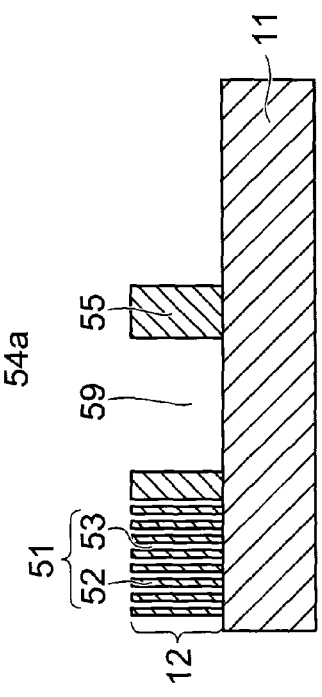
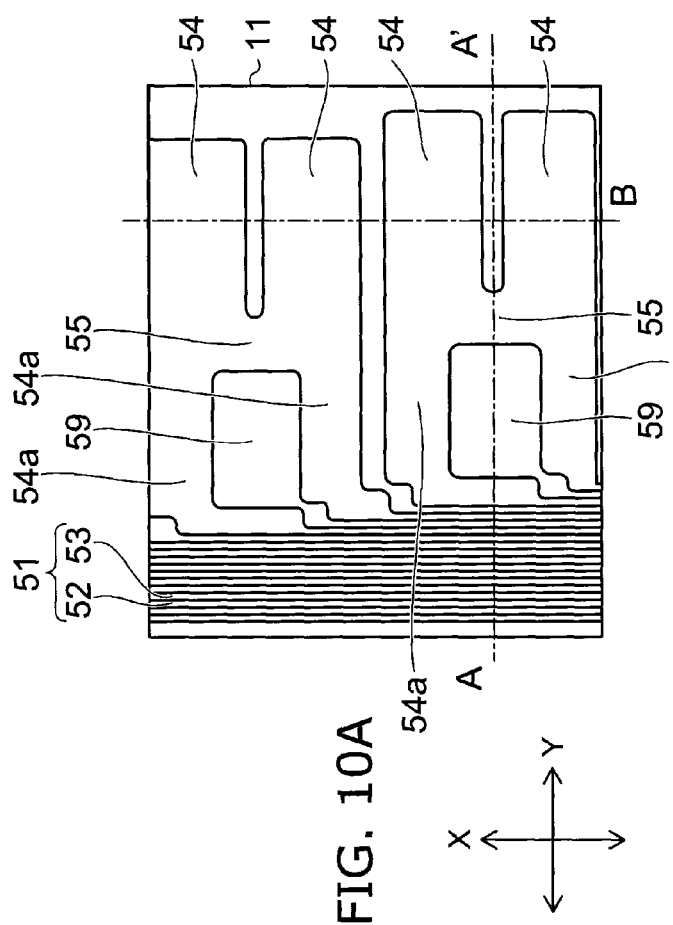

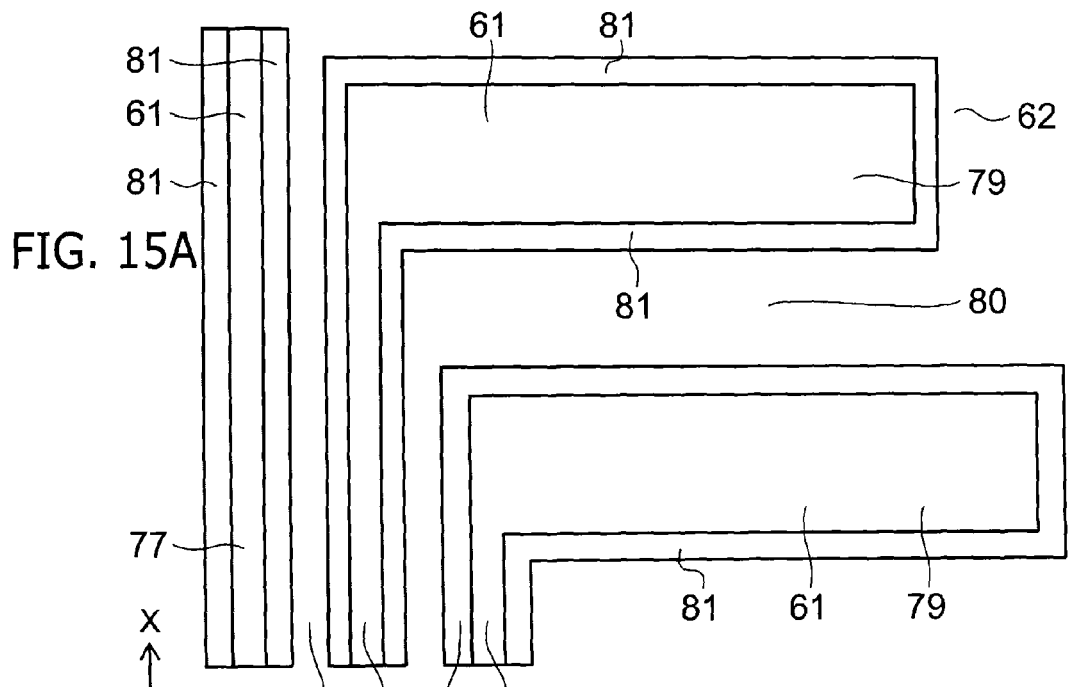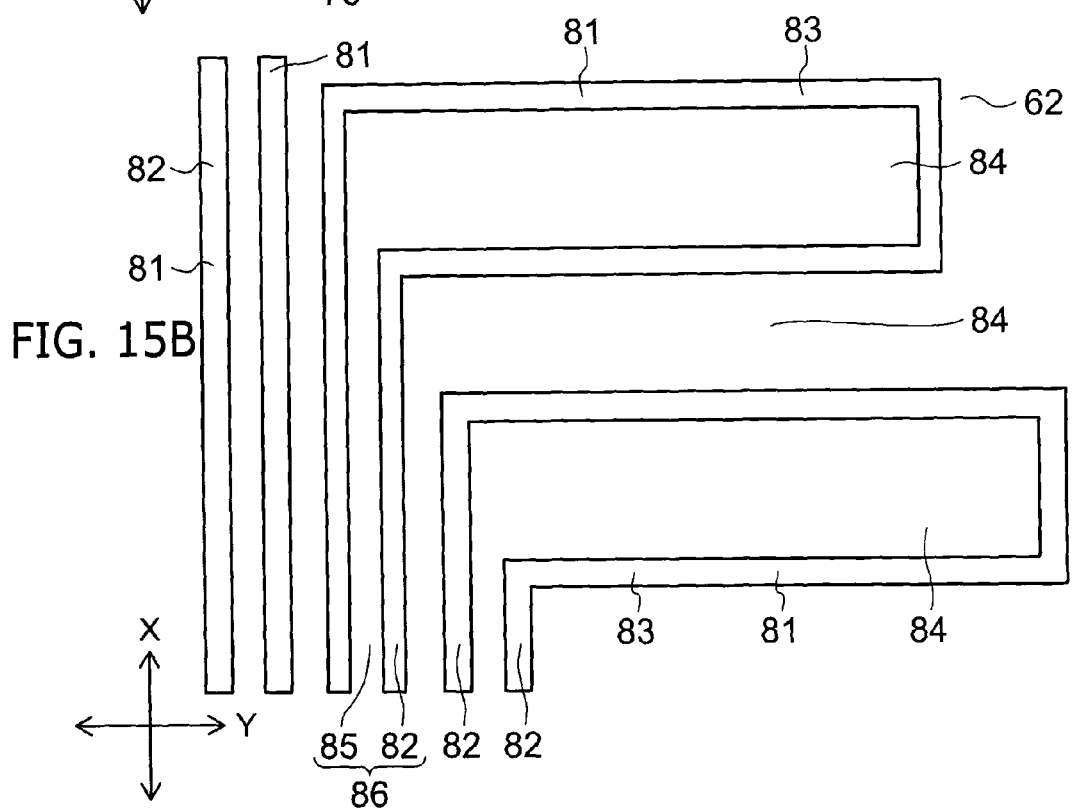

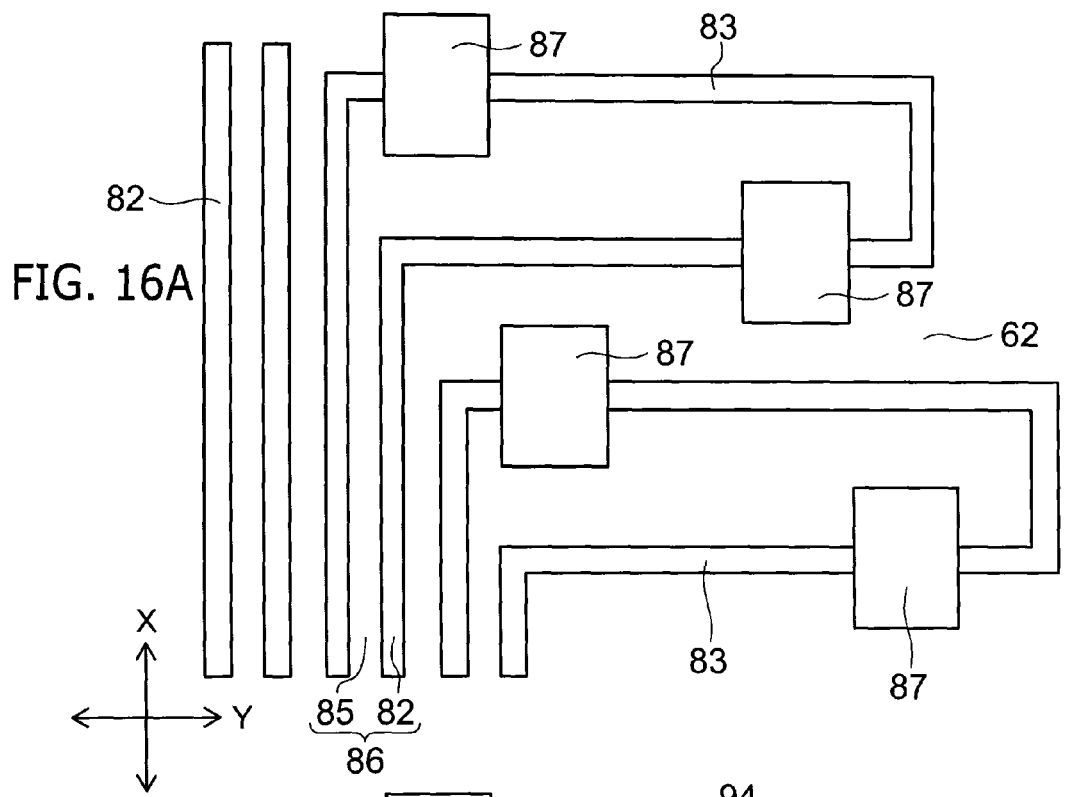
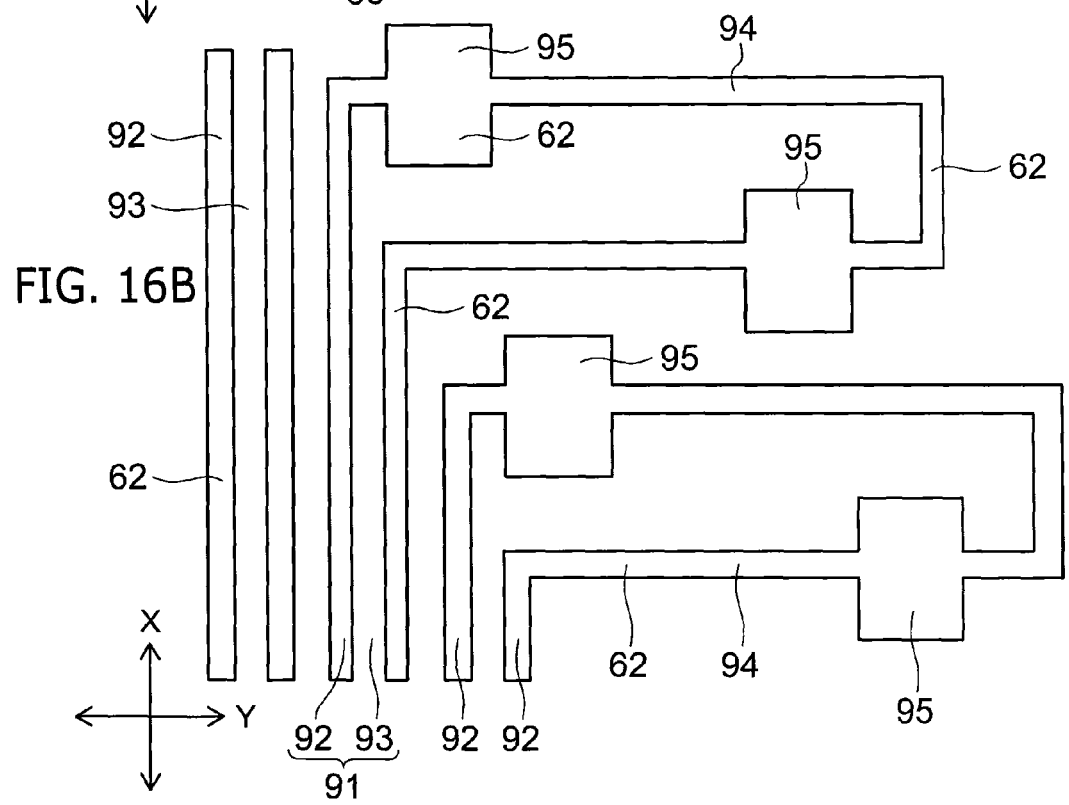

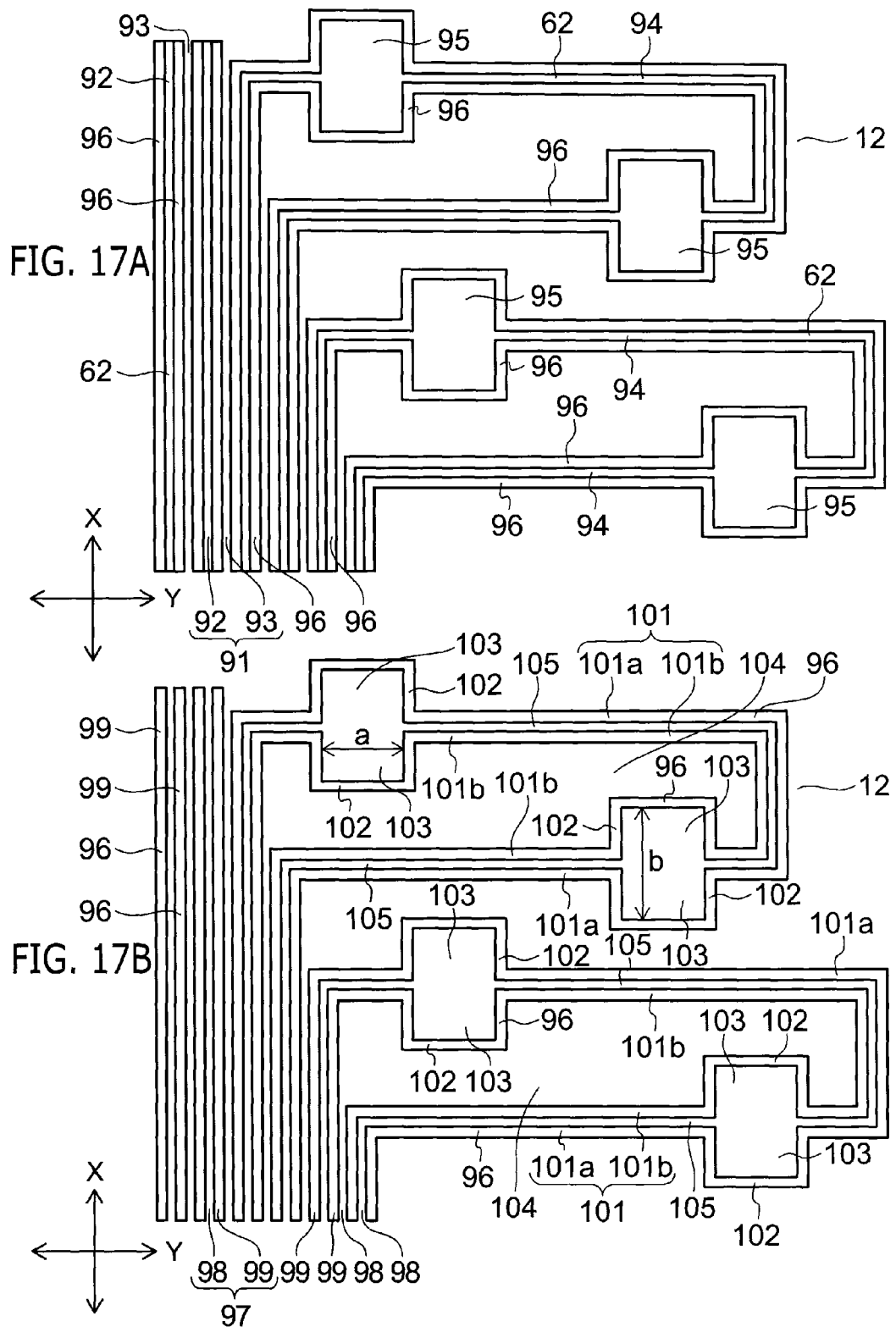

METHOD FOR MANUFACTURING SEMICONDUCTOR DEVICE

CROSS-REFERENCE TO RELATED APPLICATION

This application is based upon and claims the benefit of priority from U.S. Provisional Patent Application 61/695,858, filed on Aug. 31, 2012; the entire contents of which are incorporated herein by reference.

FIELD

Embodiments described herein relate generally to a method for manufacturing a semiconductor device.

BACKGROUND

As the downscaling of semiconductor devices progresses, it is necessary to form fine patterns equal to or less than the resolution limit of the lithography. As a method for realizing this, a so-called sidewall transfer process has been proposed in which sidewall films are formed on side walls extending in a longitudinal direction of sacrificial films (core members) formed by lithography in line configurations, and subsequently the sacrificial films are removed and the sidewall films remain.

In the case where, for example, a fine interconnect pattern is formed by such a sidewall transfer process, an interconnect pattern having a line width corresponding to the film thickness of the sidewall film can be formed. However, generally, in the interconnect pattern of an actual semiconductor device, broad patterns are disposed here and there in the pattern layout to provide connections to the interconnect layers above and below by vias.

BRIEF DESCRIPTION OF THE DRAWINGS

FIGS. 1A to 13C are schematic views showing a method for manufacturing a semiconductor device of a first embodiment;

FIGS. 14A to 20B are schematic views showing a method for manufacturing a semiconductor device of a second embodiment.

DETAILED DESCRIPTION

Figure 1C:
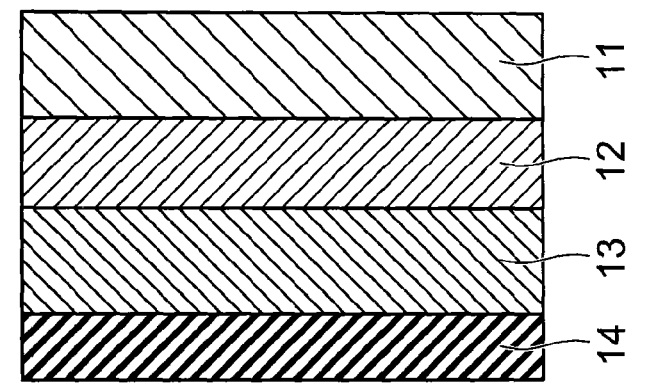
Figure 1A:
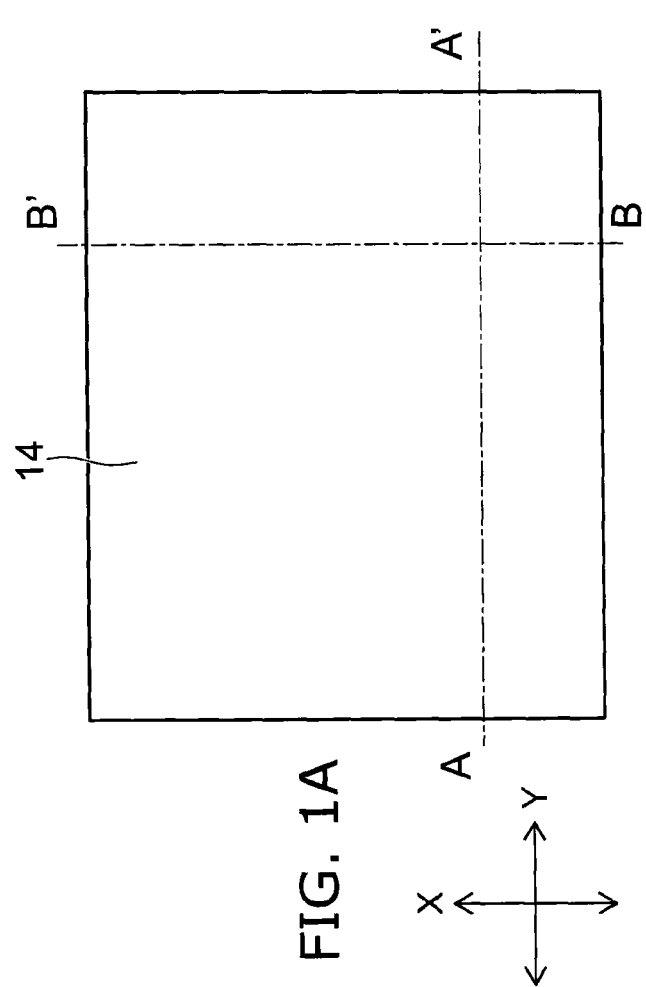

According to one embodiment, a method for manufacturing a semiconductor device includes forming a plurality of first line patterns and a plurality of second line patterns above a patterning film, the plurality of first line patterns extending in a first direction and being arranged to be separated by a first inter-line pattern space, the plurality of second line patterns communicating with end portions of the first line patterns and being arranged to be separated by a second inter-line pattern space having a width greater than a width of the first inter-line pattern space. The method includes forming a film having different filling properties dependent on space width above the patterning film to cover the first line patterns and the second line patterns to form the film on the first line patterns and on the first inter-line pattern space while making a cavity in the first inter-line pattern space and to form the film on at least a bottom portion of the second inter-line pattern space and a side wall of each of the second line patterns. The method includes performing etch-back of the film to remove the film on the first line patterns and on the first inter-line pattern space while causing the film to remain on at least the side wall of each of the second line patterns. The method includes etching the patterning film using the remaining film, the first line patterns, and the second line patterns as a mask.

Embodiments will now be described with reference to the drawings. Similar components in the drawings are marked with like reference numerals.

First Embodiment

FIG. 1A to FIG. 11C are schematic views showing a method for manufacturing a semiconductor device of a first embodiment.

In each of the drawings, A is a schematic top view; B is an A-A' cross-sectional view of A; and C is a B-B' cross-sectional view of A. In A of each of the drawings, an X direction is taken as a first direction; and a Y direction orthogonal to the X direction is taken as a second direction. B of each of the drawings is a cross-sectional view along the Y direction; and C of each of the drawings is a cross-sectional view along the X direction.

FIG. 12A to FIG. 13C are schematic cross-sectional views showing a method for manufacturing the semiconductor device of the first embodiment.

Figure 1B:
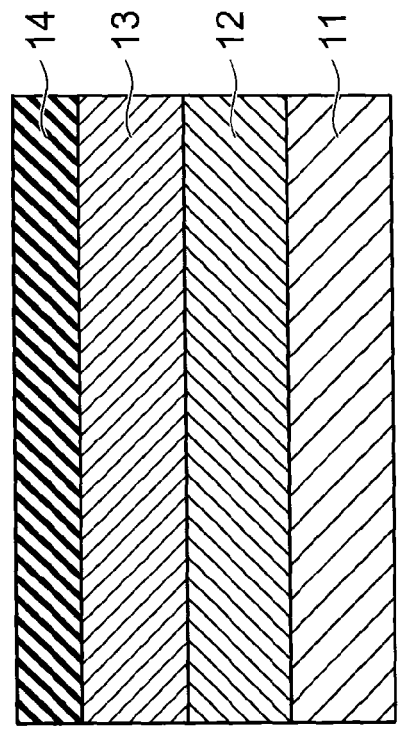

First, as shown in FIGS. 1B and C, a patterning film 12 is formed on a substrate 11. The substrate 11 is, for example, a silicon substrate. The semiconductor device of the embodiment is, for example, a nonvolatile semiconductor memory device; an active region (a channel region) is formed at the surface of the substrate 11; and a tunneling insulating film is formed on the active region.

The patterning film 12 includes, for example, a charge storage layer such as a floating electrode, a trap insulating film, etc., formed on the tunneling insulating film, an intermediate insulating film formed on the charge storage layer, and a control electrode formed on the intermediate insulating film.

A sacrificial film 13 is formed on the patterning film 12. A silicon oxide film is formed as the sacrificial film 13 by plasma CVD (chemical vapor deposition) method using, for example, TEOS (tetraethoxysilane) as a source gas. Or, an amorphous silicon film is formed as the sacrificial film 13.

A resist film 14 is formed on the sacrificial film 13. Exposure of the resist film 14 is performed by lithography technology. Then, by developing after the exposure, the pattern of the resist film 14 is formed as shown in FIGS. 2A to C.

The pattern of the resist film 14 includes a line-and-space pattern 21 including multiple resist film line patterns 22 extending in the X direction. The multiple resist film line patterns 22 are arranged in the Y direction orthogonal to the X direction to be separated by a first space 23.

The pattern of the resist film 14 includes fringe portions 25 communicating with end portions of the resist film line patterns 22. Multiple fringe portions 25 are arranged in the X direction. The widths of the fringe portions 25 in the X direction are greater than the widths of the resist film line patterns 22 in the Y direction.

A second space 26 is made between the fringe portions 25 adjacent to each other in the X direction. The width of the second space 26 in the X direction is greater than the width in the Y direction of the first space 23 made between the resist film line patterns 22.

The fringe portion 25 includes a first fringe portion 25a that communicates directly with the end portion of the resist film line pattern 22, and a second fringe portion 25b formed between the first fringe portions 25a arranged in the X direction.

One Y-direction end portion of the second fringe portion 25b is partitionally separated from the resist film line patterns 22 by a third space 27; and the other Y-direction end portion of the second fringe portion 25b communicates with the first fringe portion 25a.

The length of the second fringe portion 25b in the Y direction is shorter than the length of the first fringe portion 25a in the Y direction. The first fringe portion 25a and the second fringe portion 25b are arranged alternately in the X direction.

The X-direction width and the Y-direction width of the third space 27 are greater than the width of the first space 23 between the resist film line patterns 22 in the Y direction and the width of the second space 26 between the fringe portions 25 in the X direction.

After forming the pattern of the resist film 14, the pattern of the sacrificial film 13 is formed as shown in FIGS. 3A to C by etching the sacrificial film 13 by RIE (reactive ion etching) method using the pattern of the resist film 14 as a mask.

The pattern of the sacrificial film 13 includes a line-and-space pattern 31 including multiple sacrificial film line patterns 32 extending in the X direction. The multiple sacrificial film line patterns 32 are arranged in the Y direction to be separated by a first space 33.

The pattern of the sacrificial film 13 includes fringe portions 35 communicating with end portions of the sacrificial film line patterns 32. Multiple fringe portions 35 are arranged in the X direction. The widths of the fringe portions 35 in the X direction are greater than the widths of the sacrificial film line patterns 32 in the Y direction.

A second space 36 is made between the fringe portions 35 adjacent to each other in the X direction. The width of the second space 36 in the X direction is greater than the width in the Y direction of the first space 33 formed between the sacrificial film line patterns 32.

The fringe portion 35 includes a first fringe portion 35a that communicates directly with the end portion of the sacrificial film line pattern 32, and a second fringe portion 35b formed between the first fringe portions 35a arranged in the X direction.

One Y-direction end portion of the second fringe portion 35b is partitionally separated from the sacrificial film line pattern 32 by a third space 37; and the other Y-direction end portion of the second fringe portion 35b communicates with the first fringe portion 35a. The length of the second fringe portion 35b in the Y direction is shorter than the length of the first fringe portion 35a in the Y direction. The first fringe portion 35a and the second fringe portion 35b are arranged alternately in the X direction.

The X-direction width and the Y-direction width of the third space 37 are greater than the width of the first space 33 between the sacrificial film line patterns 32 in the Y direction and the width of the second space 36 between the fringe portions 35 in the X direction.

Then, as shown in FIGS. 4A to C, slimming of the pattern of the sacrificial film 13 is performed by, for example, hydrofluoric acid treatment. The widths of the sacrificial film line patterns 32 become about ½ of those prior to the slimming. The width of the first space 33 between the sacrificial film line patterns 32 is widened to about 3 times the widths of the sacrificial film line patterns 32 after the slimming.

By the slimming recited above, the side walls of the fringe portions 35 also are receded about the same as the receded amount of the side walls of the sacrificial film line patterns 32; and slimming of the fringe portions 35 also is performed.

After the slimming of the pattern of the sacrificial film 13, a sidewall film 40 is formed conformally on the side walls and the top surface of the pattern of the sacrificial film 13 and the top surface of the patterning film 12 (the bottom surface of each of the spaces 33, 36, and 37) as shown in FIGS. 5A to C. For example, a silicon nitride film of a type dissimilar to the sacrificial film 13 and the patterning film 12 is formed as the sidewall film 40.

Subsequently, etch-back of the sidewall film 40 is performed to remove the sidewall film 40 that is on the top surface of the sacrificial film 13 and the sidewall film 40 that is on the top surface of the patterning film 12. As shown in FIGS. 6A to C, the top surface of the sacrificial film 13 and the top surface of the patterning film 12 are exposed; and the sidewall film 40 remains on the side walls of the sacrificial film 13.

Then, the sacrificial film 13 is removed by, for example, hydrofluoric acid treatment; and the sidewall film 40 is caused to remain on the patterning film 12 as shown in FIGS. 7A to C.

The sidewall film 40 formed on the side walls of the sacrificial film line patterns 32 remains on the patterning film 12 as first line patterns 42. The multiple first line patterns 42 extending in the X direction are arranged in the Y direction to be separated by a first space 43 as the space between the first line patterns 42.

By the sidewall transfer process described above, a line-and-space pattern 41 arranged at a pitch that is narrower than the pitch limited by the resolution limit of the lithography is obtained. In other words, the line-and-space pattern 41 arranged at a pitch that is narrower than the pitch of the line-and-space pattern 31 of the sacrificial film 13 of FIGS. 3A and B limited by the resolution limit of the lithography is obtained. The pitch of the line-and-space pattern 41 is about ½ of the pitch of the line-and-space pattern 31 of the sacrificial film 13.

The sidewall film 40 that was formed on the side walls of the fringe portions 35 of the sacrificial film 13 remains on the patterning film 12 as second line patterns 45 extending in the Y direction to communicate with the end portions of the first line patterns 42. The widths of the second line patterns 45 and the widths of the first line patterns 42 are substantially the same.

As shown in FIG. 6A, the sidewall film 40 remains in a comb-shaped planar pattern on the side walls of the fringe portions 35 of the sacrificial film 13; and the second line patterns 45 are formed in a comb-shaped planar pattern as shown in FIG. 7A.

The multiple second line patterns 45 are arranged in the X direction to be separated by a second space 46 as the space between the second line patterns 45 to communicate with the end portions of the first line patterns 42.

The width of the second space 46 in the X direction is greater than the width of the first space 43 between the first line patterns 42 in the Y direction.

A third space 47 is made as the space between the second line patterns 45 between two line pattern groups including the multiple second line patterns 45 arranged to be separated by the second space 46 to communicate with each of the end portions of a pair of the first line patterns 42 arranged adjacently to each other in the Y direction. The width of the third space 47 in the X direction is greater than the width of the first space 43 in the Y direction and the width of the second space 46 in the X direction.

The mutually-adjacent second line patterns 45 separated by the second space 46 communicate with each other at one end portion on the side distal to the first line patterns 42.

The mutually-adjacent second line patterns 45 separated by the third space 47 communicate with each other at the other end portion on the side proximal to the first line patterns 42.

A fourth space 49 is made as a space between the second line patterns 45 between a connection portion 48 at the other end portion of the second line patterns 45 and the line-and-space pattern 41 of the first line patterns 42 and the first spaces 43. The X-direction width and the Y-direction width of the fourth space 49 are greater than the width of the first space 43 in the Y direction, the width of the second space 46 in the X direction, and the width of the third space 47 in the X direction.

Then, as shown in FIGS. 8A to C, a film 50 is formed on the patterning film 12 to cover the first line patterns 42 and the second line patterns 45.

A silicon oxide film is formed as the film 50 by, for example, plasma CVD (chemical vapor deposition) method using silane ($SiH_4$) as a source gas. The film 50 has different filling properties into spaces dependent on the space width.

Figure 12A:
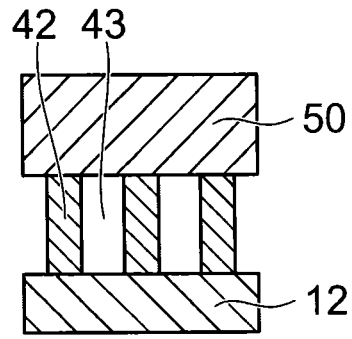

As shown in FIG. 8B and FIG. 12A, the film 50 is not filled into the first space 43 having the narrow width. Accordingly, the film 50 is formed on the first line patterns 42 and on the first space 43 while making a cavity in the first space 43.

Figure 12B:
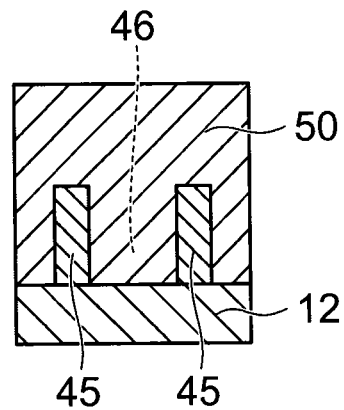

As shown in FIG. 8C and FIG. 12B, the film 50 is formed conformally along the side walls and the top surface of the second line patterns 45 and the bottom portion of the second space 46. The width of the second space 46 in the X direction is greater than the width of the first space 43 in the Y direction and less than twice the film thickness of the film 50 formed on the side walls of the second line patterns 45. Accordingly, the film 50 is filled into the second space 46.

Figure 12C:
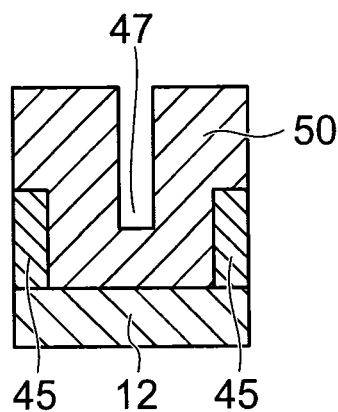

As shown in FIG. 8C and FIG. 12C, the film 50 is formed conformally on the bottom portion of the third space 47 and the side walls of the second line patterns 45. The width of the third space 47 in the X direction is greater than twice the film thickness of the film 50 formed on the side walls of the second line patterns 45. Accordingly, the film 50 is formed on the bottom portion of the third space 47 without the third space 47 being filled with the film 50.

As shown in FIG. 8B, the film 50 is formed conformally on the fourth space 49 having widths in the X direction and the Y direction greater than the width of the third space 47 in the X direction; and the fourth space 49 is not filled with the film 50.

Other than the silicon oxide film formed by plasma CVD method using silane as the source gas, a silicon oxide film formed by plasma CVD method using TEOS as a source gas, a carbon film formed by plasma CVD method, or a silicon nitride film formed by plasma CVD method can be used as the film 50 having different filling properties into the space dependent on the space width such as that described above.

Then, etch-back of the film 50 is performed.

Figure 13A:
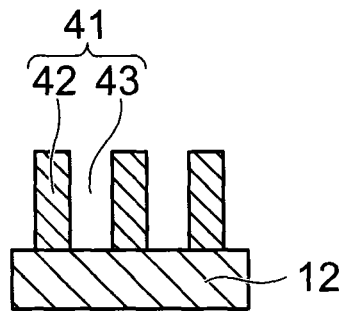

The film 50 on the first line patterns 42 and on the first space 43 is removed as shown in FIGS. 9A and B and FIG. 13A by the etch-back of the film 50. The state in which the first space 43 is not filled with the film 50 is maintained.

Figure 13B:
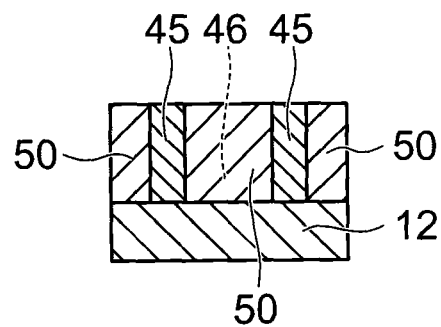

The film 50 on the second line patterns 45 and on the second space 46 is removed as shown in FIGS. 9A and C and FIG. 13B by the etch-back of the film 50. The state in which the film 50 is filled into the second space 46 is maintained.

Figure 13C:
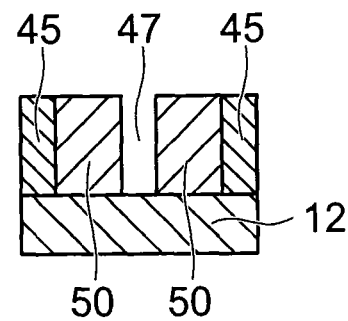

The film 50 of the bottom portion of the third space 47 is removed as shown in FIGS. 9A and C and FIG. 13C by the etch-back of the film 50; and the film 50 remains on the side walls of the second line patterns 45 inside the third space 47. In other words, the width of the third space 47 in the X direction is narrower than prior to forming the film 50.

The film 50 of the bottom portion of the fourth space 49 is removed as shown in FIGS. 9A and B by the etch-back of the film 50; and the film 50 remains on the side wall of the first line patterns 42 and the side walls of the second line patterns 45 inside the fourth space 49. In other words, the width in the Y direction and the width in the X direction of the fourth space 49 are narrower than prior to forming the film 50.

Then, the patterning film 12 is etched using the film 50 remaining on the patterning film 12, the first line patterns 42, and the second line patterns 45 as a mask.

By etching, a portion of the patterning film 12 is patterned into a line-and-space pattern 51 arranged at a pitch that is narrower than that of the line-and-space pattern 21 of the resist film 14 as shown in FIGS. 10A to C. Also, contact fringe portions 54 of the patterning film 12 having widths greater than the widths of line patterns 52 are formed to communicate with the end portions of the line patterns 52 of the line-and-space pattern 51.

Figure 11C:
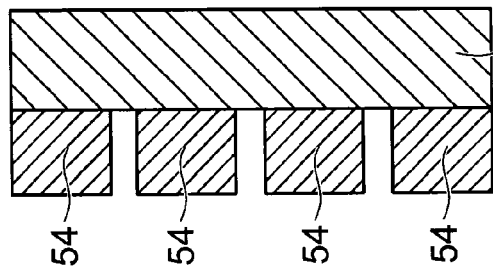
Figure 11A:
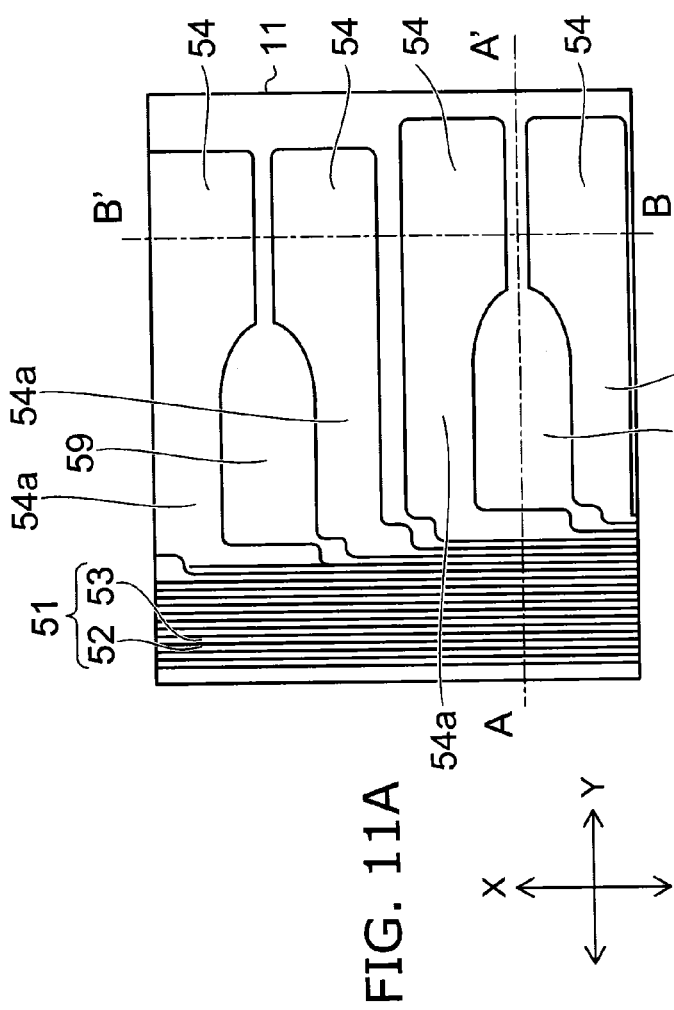
Figure 11B:
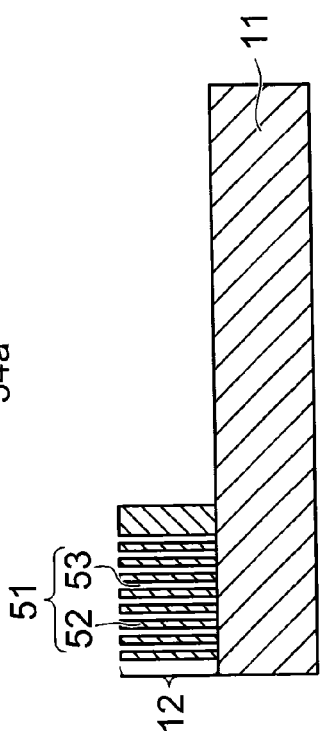

Then, the pattern of the patterning film 12 shown in FIGS. 11A to C is obtained by cutting a portion 55 where the contact fringe portions 54 adjacent to each other in the X direction communicate by etching using a not-shown mask.

The pattern of the patterning film 12 includes the line-and-space pattern 51 and the contact fringe portions 54.

In the line-and-space pattern 51, the multiple line patterns 52 extending in the X direction are arranged in the Y direction to be separated by a space 53.

The contact fringe portions 54 communicate with each of the end portions of the line patterns 52; and the contact fringe portions 54 extend in the Y direction. Multiple contact fringe portions 54 corresponding to the number of the line patterns 52 are arranged in the X direction.

The widths of the contact fringe portions 54 in the X direction are greater than the widths of the line patterns 52 in the Y direction. Not-shown vias are provided on the contact fringe portions 54; and each of the line patterns 52 is electrically connected to an interconnect layer that functions as a bit line or a source line of the memory device by the via and the contact fringe portion 54.

According to the first embodiment described above, the contact fringe portions 54 for which a pattern size equal to or less than the resolution limit of the lithography is unnecessary also can be formed simultaneously when utilizing the sidewall transfer process to form the fine line-and-space pattern 51 equal to or less than the resolution limit of the lithography.

Here, in a sidewall transfer process as a comparative example, a method may be considered in which the reduction of the pattern width of the contact fringe portions is prevented while forming the sidewall film line-and-space pattern having the narrow pitch by removing the sacrificial film in a state in which the region where the contact fringe portions are formed is covered and protected with a resist film after forming the sidewall film on the side walls of the sacrificial film. However, the method of this comparative example includes a patterning process of the resist film for covering the region where the contact fringe portions are formed; and this may lead to an increase of the manufacturing cost.

Conversely, according to the first embodiment, the sacrificial film 13 is removed from the entire region without the region where the contact fringe portions 54 are formed being covered with the resist film. Then, after removing the sacrificial film 13, the pattern width of the pattern used to form the mask to form the contact fringe portions 54 can be increased without increasing the pattern width of the line-and-space pattern 41 of the sidewall film 40 by forming the film 50 having different filling properties dependent on the space width on the patterning film 12 where the sidewall film 40 remains and by performing etch-back of the film 50. In other words, when removing the sacrificial film 13, the lithography process of patterning the resist film covering the region where the contact fringe portions 54 are formed is unnecessary; and the manufacturing cost can be reduced.

For the second line patterns 45 shown in FIG. 7A, the contact fringe portions may be formed by utilizing the portions arranged in the X direction to be separated by the fourth space 49 without providing the portions arranged in the X direction to be separated by the second space 46 and the third space 47.

By the etch-back of the film 50 described above as shown in FIG. 9A, the film 50 remains on the side walls of the second line patterns 45 arranged in the X direction to be separated by the fourth space 49; and the film 50 of the bottom portion of the fourth space 49 on the inner side of the film 50 that remains on the side walls is removed. Accordingly, the films 50 formed on the side walls of different second line patterns 45 do not communicate with each other in the X direction.

By the film 50 remaining on the side walls of the second line patterns 45 arranged to be separated by the fourth space 49, the portion having a width greater than the line widths of the second line patterns 45 having fine line widths due to the sidewall transfer process is formed in the contact fringe region.

The broad portion becomes a mask; and after the etching of the patterning film 12, contact fringe portions 54a having wider widths than those of the first line patterns 52 are formed to be separated by a space 59 which is wider than the first space 53.

Second Embodiment

FIG. 14A to FIG. 19 are schematic top views showing a method for manufacturing a semiconductor device of a second embodiment. In each of the drawings of FIG. 14A to FIG. 19, the X direction is taken as the first direction; and the Y direction orthogonal to the X direction is taken as the second direction.

Figure 14A:
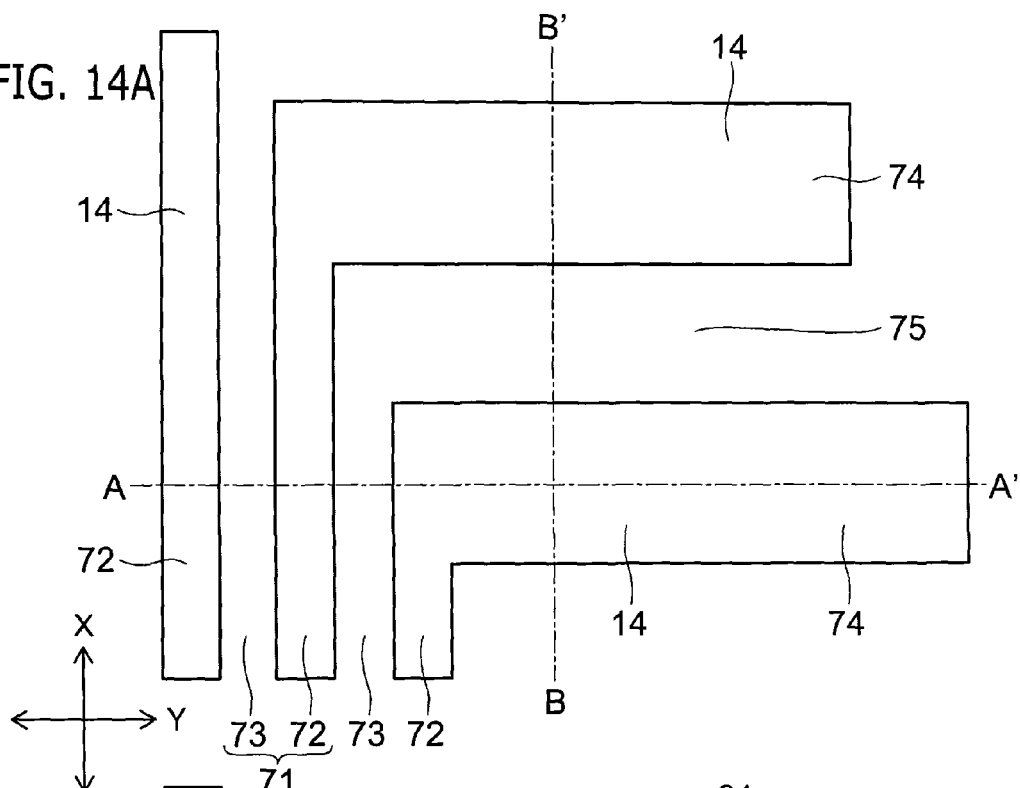
Figure 20A:
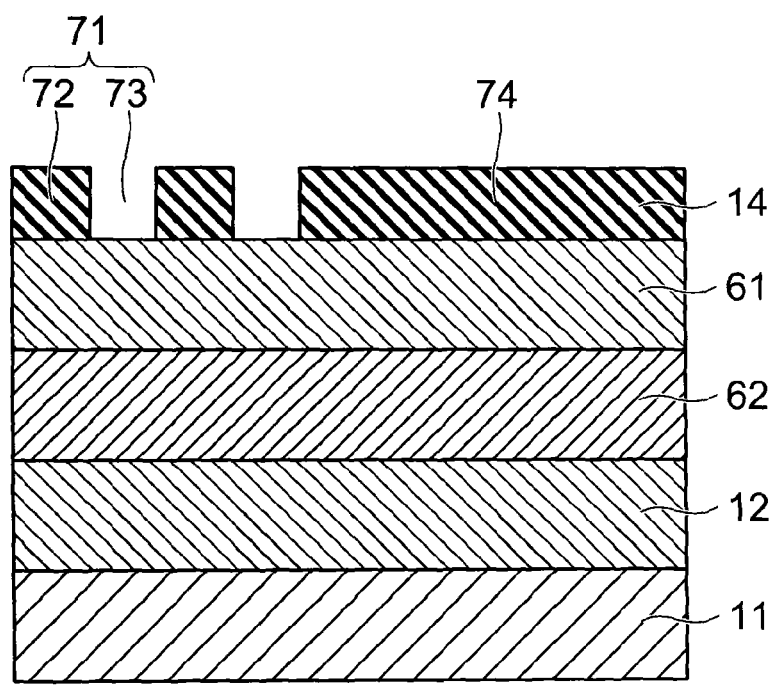
Figure 20B:
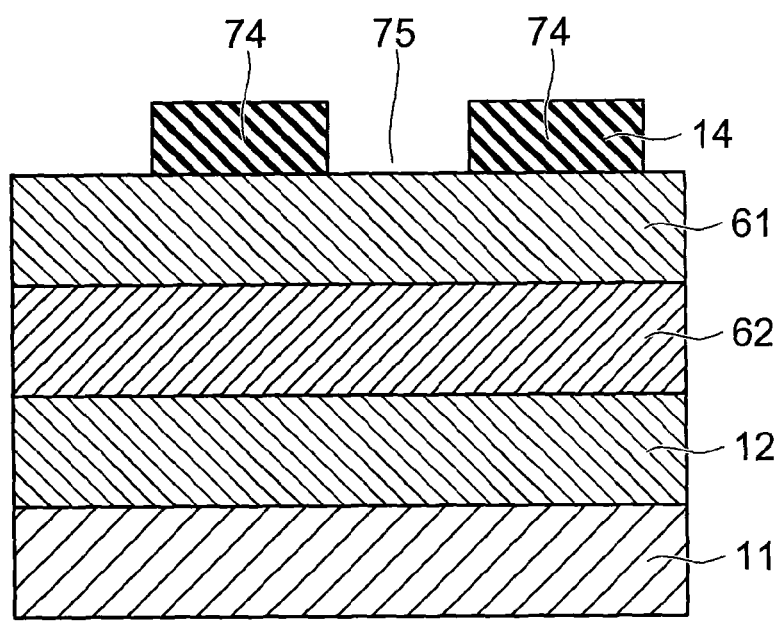

FIG. 20A is an A-A' cross-sectional view of FIG. 14A; and FIG. 20B is a B-B' cross-sectional view of FIG. 14A.

First, as shown in FIGS. 20A and B, the patterning film 12 is formed on the substrate 11. Similarly to the first embodiment, the substrate 11 is, for example, a silicon substrate; an active region (a channel region) is formed at the surface of the substrate 11; and a tunneling insulating film is formed on the active region.

Similarly to the first embodiment, the patterning film 12 includes, for example, a charge storage layer such as a floating electrode, a trap insulating film, etc., formed on the tunneling insulating film, an intermediate insulating film formed on the charge storage layer, and a control electrode formed on the intermediate insulating film.

A second sacrificial film 62 is formed on the patterning film 12; and a first sacrificial film 61 having a different type of material than the second sacrificial film 62 is formed on the second sacrificial film 62. For example, one selected from the second sacrificial film 62 and the first sacrificial film 61 is a silicon oxide film formed by plasma CVD method using TEOS as a source gas; and the other selected from the second sacrificial film 62 and the first sacrificial film 61 is an amorphous silicon film.

The resist film 14 is formed on the first sacrificial film 61. Exposure of the resist film 14 is performed by lithography technology. Then, by developing after the exposure, the pattern of the resist film 14 is formed as shown in FIGS. 20A and B and FIG. 14A.

As shown in FIG. 14A, the pattern of the resist film 14 includes a line-and-space pattern 71 including multiple resist film line patterns 72 extending in the X direction. The multiple resist film line patterns 72 are arranged to be separated by a space 73 in the Y direction orthogonal to the X direction.

The pattern of the resist film 14 includes fringe portions 74 communicating with the end portions of the resist film line patterns 72. The fringe portions 74 protrude in the Y direction from the end portions of the resist film line patterns 72.

Multiple fringe portions 74 corresponding to the number of the resist film line patterns 72 are arranged to be separated by a space 75 in the X direction. The widths of the fringe portions 74 in the X direction are greater than the widths of the resist film line patterns 72 in the Y direction. The width of the space 75 between the fringe portions 74 in the X direction is greater than the width of the space 73 of the line-and-space pattern 71 in the Y direction.

Figure 14B:
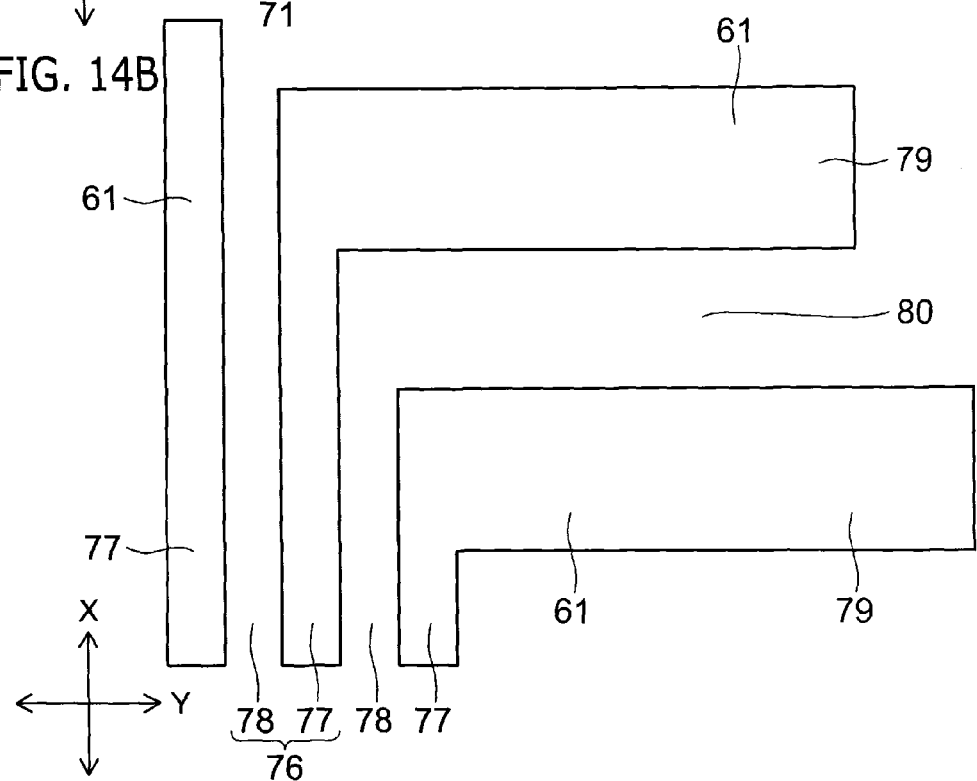

After forming the pattern of the resist film 14, the pattern of the first sacrificial film 61 is formed as shown in FIG. 14B by etching the first sacrificial film 61 by RIE method using the pattern of the resist film 14 as a mask.

The pattern of the first sacrificial film 61 includes a line-and-space pattern 76 including multiple first sacrificial film line patterns 77 extending in the X direction. The multiple first sacrificial film line patterns 77 are arranged to be separated by a space 78 in the Y direction.

The pattern of the first sacrificial film 61 includes fringe portions 79 communicating with the end portions of the first sacrificial film line patterns 77. The fringe portions 79 protrude in the Y direction from the end portions of the first sacrificial film line patterns 77.

Multiple fringe portions 79 corresponding to the number of the first sacrificial film line patterns 77 are arranged to be separated by a space 80 in the X direction.

The widths of the fringe portions 79 in the X direction are greater than the widths of the first sacrificial film line patterns 77 in the Y direction. The width of the space 80 between the fringe portions 79 in the X direction is greater than the width of the space 78 of the line-and-space pattern 76 in the Y direction.

Then, slimming of the pattern of the first sacrificial film 61 is performed by, for example, hydrofluoric acid treatment. The widths of the first sacrificial film line patterns 77 become about ½ of those prior to the slimming.

By the slimming recited above, the side walls of the fringe portions 79 also are receded about the same as the receded amount of the side walls of the first sacrificial film line patterns 77; and slimming of the fringe portions 79 also is performed.

After the slimming of the pattern of the first sacrificial film 61, a first sidewall film 81 is formed on the side walls of the pattern of the first sacrificial film 61 as shown in FIG. 15A.

For example, a silicon nitride film of a type dissimilar to the first sacrificial film 61 and the second sacrificial film 62 is formed conformally on the side walls and the top surface of the pattern of the first sacrificial film 61 and the top surface of the second sacrificial film 62 as the first sidewall film 81.

Subsequently, etch-back of the first sidewall film 81 is performed to remove the first sidewall film 81 that is on the top surface of the first sacrificial film 61 and the first sidewall film 81 that is on the top surface of the second sacrificial film 62. The top surface of the first sacrificial film 61 and the top surface of the second sacrificial film 62 are exposed; and the first sidewall film 81 remains on the side walls of the first sacrificial film 61.

Then, the first sacrificial film 61 is removed by, for example, hydrofluoric acid treatment; and the first sidewall film 81 is caused to remain on the second sacrificial film 62 as shown in FIG. 15B.

The first sidewall film 81 formed on the side walls of the first sacrificial film line patterns 77 remains on the second sacrificial film 62 as first sidewall film line patterns 82. The multiple first sidewall film line patterns 82 extending in the X direction are arranged in the Y direction to be separated by a space 85.

By the sidewall transfer process utilizing the first sacrificial film 61 and the first sidewall film 81 described above, a line-and-space pattern 86 arranged at a pitch that is narrower than the pitch limited by the resolution limit of the lithography is obtained. In other words, the line-and-space pattern 86 arranged at a pitch that is narrower than the pitch of the line-and-space pattern 76 of the first sacrificial film 61 of FIG. 14B limited by the resolution limit of the lithography is obtained. The pitch of the line-and-space pattern 86 is about ½ of the pitch of the line-and-space pattern 76 of the first sacrificial film 61.

The first sidewall film 81 that was formed on the side walls of the fringe portions 79 of the first sacrificial film 61 remains on the second sacrificial film 62 as first sidewall film loop patterns 83 communicating with the end portions of the first sidewall film line patterns 82. The widths of the first sidewall film line patterns 82 and the widths of the first sidewall film loop patterns 83 are substantially the same.

The width of a space 84 between the first sidewall film loop patterns 83 in the X direction is greater than the width of the space 85 between the first sidewall film line patterns 82 in the Y direction.

One first sidewall film loop pattern 83 communicates with a pair of mutually-adjacent first sidewall film line patterns 82 arranged in the Y direction.

After forming the pattern of the first sidewall film 81 on the second sacrificial film 62, the first sidewall film loop patterns 83 are covered selectively with a resist film 87 as shown in FIG. 16A.

Then, the second sacrificial film 62 of the lower layer is etched using the first sidewall film line patterns 82, the first sidewall film loop patterns 83, and the resist film 87 as a mask. The pattern of the second sacrificial film 62 is formed as shown in FIG. 16B by the etching.

The pattern of the second sacrificial film 62 includes a line-and-space pattern 91 including multiple second sacrificial film line patterns 92 extending in the X direction. The multiple second sacrificial film line patterns 92 are arranged to be separated by a space 93 in the Y direction.

The pattern of the second sacrificial film 62 includes second sacrificial film loop patterns 94 communicating with the end portions of the second sacrificial film line patterns 92.

One second sacrificial film loop pattern 94 communicates with a pair of mutually-adjacent second sacrificial film line patterns 92 arranged in the Y direction.

The pattern of the second sacrificial film 62 includes second sacrificial film fringe portions 95 formed selectively at the second sacrificial film loop patterns 94.

The second sacrificial film loop patterns 94 are formed in line configurations having substantially the same widths as the second sacrificial film line patterns 92.

The second sacrificial film fringe portions 95 are formed in quadrilateral configurations protruding in the X direction from the second sacrificial film loop patterns 94. The X-direction widths and the Y-direction widths of the second sacrificial film fringe portions 95 are greater than the widths of the second sacrificial film line patterns 92 and the widths of the second sacrificial film loop patterns 94.

Two second sacrificial film fringe portions 95 are formed for one second sacrificial film loop pattern 94 with the positions shifted in the Y direction.

One second sacrificial film fringe portion 95 is formed for one line portion of the second sacrificial film loop patterns 94 extending in the Y direction.

Then, slimming of the pattern of the second sacrificial film 62 is performed by, for example, hydrofluoric acid treatment. The widths of the second sacrificial film line patterns 92 and the widths of the second sacrificial film loop patterns 94 become about ½ of those prior to the slimming. The exterior form sizes of the second sacrificial film fringe portions 95 also are reduced.

After the slimming of the pattern of the second sacrificial film 62, a second sidewall film 96 is formed on the side walls of the pattern of the second sacrificial film 62 as shown in FIG. 17A.

For example, a silicon nitride film of a type dissimilar to the second sacrificial film 62 and the patterning film 12 is formed conformally on the side walls and the top surface of the pattern of the second sacrificial film 62 and the top surface of the patterning film 12 as the second sidewall film 96.

Subsequently, etch-back of the second sidewall film 96 is performed to remove the second sidewall film 96 on the top surface of the second sacrificial film 62 and the second sidewall film 96 on the top surface of the patterning film 12. The top surface of the second sacrificial film 62 and the top surface of the patterning film 12 are exposed; and the second sidewall film 96 remains on the side walls of the pattern of the second sacrificial film 62.

Then, the second sacrificial film 62 is removed by, for example, hydrofluoric acid treatment; and the second sidewall film 96 remains on the patterning film 12 as shown in FIG. 17B.

The second sidewall film 96 formed on the side walls of the second sacrificial film line patterns 92 remains on the patterning film 12 as second sidewall film line patterns 99. The multiple second sidewall film line patterns 99 extending in the X direction are arranged in the Y direction to be separated by a first space 98.

By performing the sidewall transfer process described above twice, a line-and-space pattern 97 arranged at a pitch that is narrower than the pitch limited by the resolution limit of the lithography is obtained. The widths of the second sidewall film line patterns 99 are about ¼ of the widths of the first sacrificial film line patterns 77 of FIG. 14B limited by the resolution limit of the lithography. The pitch of the line-and-space pattern 97 is about ¼ of the pitch of the line-and-space pattern 76 of the first sacrificial film 61 of FIG. 14B.

The second sidewall film 96 that was formed on the side walls of the second sacrificial film loop patterns 94 remains on the patterning film 12 as second sidewall film loop patterns 101 communicating with the end portions of the second sidewall film line patterns 99. The widths of the second sidewall film line patterns 99 and the widths of the second sidewall film loop patterns 101 are substantially the same.

The second sidewall film loop pattern 101 includes an outer side loop pattern 101a, and an inner side loop pattern 101b formed on the inner side of the outer side loop pattern 101a to be separated from the outer side loop pattern 101a by a space 105 having substantially the same width as the first space 98 between the second sidewall film line patterns 99.

Two second sidewall film fringe portions 102 protruding in mutually opposite X directions communicate with one outer side loop pattern 101a.

Also, two second sidewall film fringe portions 102 protruding in mutually opposite X directions communicate with one inner side loop pattern 101b.

The second sidewall film fringe portion 102 formed in the outer side loop pattern 101a and the second sidewall film fringe portion 102 formed in the inner side loop pattern 101b on the inner side of the outer side loop pattern 101a protrude in mutually opposite X directions at the same position in the Y direction.

Two second sidewall film fringe portions 102 having positions shifted in the Y direction are formed on the inner side of the inner side loop pattern 101b to protrude in mutually opposite X directions.

Two second sidewall film fringe portions 102 having positions shifted in the Y direction are formed to protrude in mutually opposite X directions between the outer side loop patterns 101a adjacent to each other in the X direction.

A third space 103 is made on the inner side of the second sidewall film fringe portions 102. The width a of the third space 103 in the Y direction is greater than the width of the first space 98 between the second sidewall film line patterns 99 in the Y direction.

A second space 104 is made on the inner side of the inner side loop pattern 101b. The width of the second space 104 in the X direction is greater than the width of the first space 98 and the width a of the third space 103.

The space width from the second sidewall film fringe portion 102 formed in the inner side loop pattern 101b to the inner side loop pattern 101b opposing the second sidewall film fringe portion 102 also is greater than the width of the first space 98 and the width a of the third space 103.

The width of the fourth space from the second sidewall film fringe portion 102 formed in the outer side loop pattern 101a to one other outer side loop pattern 101a opposing the second sidewall film fringe portion 102 also is greater than the width of the first space 98 and the width a of the third space 103.

The space width in the Y direction between two second sidewall film fringe portions 102 formed on the inner side of the inner side loop pattern 101b also is greater than the width of the first space 98 and the width a of the third space 103.

The space width in the Y direction between two second sidewall film fringe portions 102 formed between the outer side loop patterns 101a also is greater than the width of the first space 98 and the width a of the third space 103.

Figure 18A:
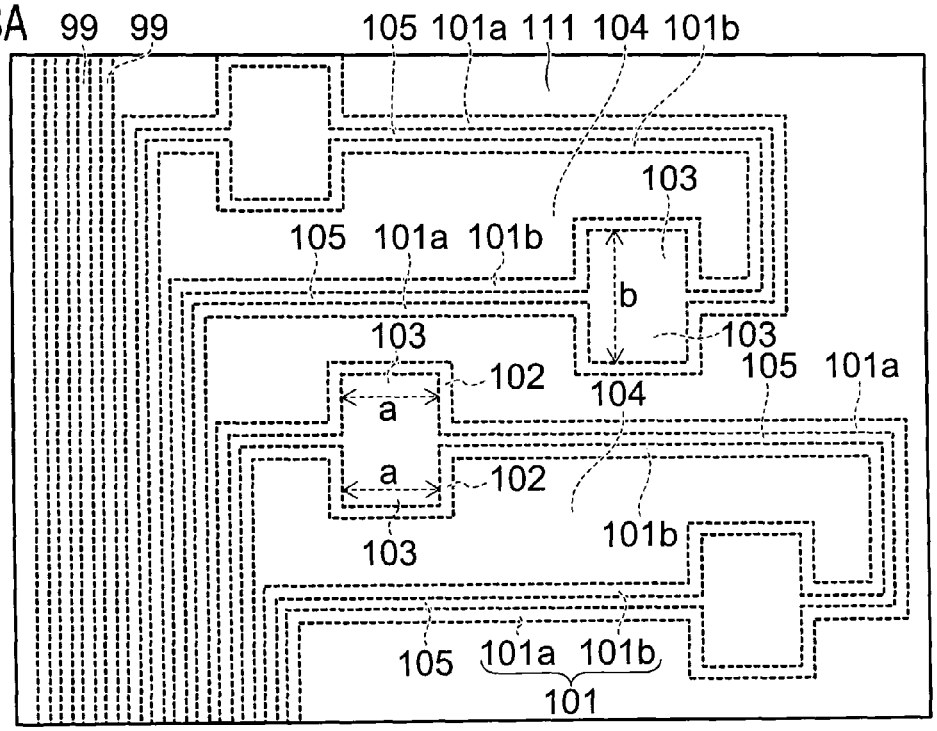

After forming the pattern of the second sidewall film 96, a film 111 is formed on the patterning film 12 to cover the pattern of the second sidewall film 96 as shown in FIG. 18A.

A silicon oxide film is formed as the film 111 by plasma CVD method using, for example, silane ($SiH_4$) as a source gas. The film 111 has different filling properties into spaces dependent on the space width.

The film 111 is not filled into the first space 98 having the narrow width and the space 105 between the outer side loop pattern 101a and the inner side loop pattern 101b. Accordingly, the film 111 is formed on the line-and-space pattern 97 while making a cavity in the first space 98; and the film 111 is formed on the second sidewall film loop patterns 101 while making a cavity on the space 105.

The film 111 is formed conformally along the side walls and the top surface of the second sidewall film fringe portions 102 because the width a in the Y direction of the third space 103 on the inner side of the second sidewall film fringe portion 102 is greater than the widths of the first space 98 and the space 105. The third space 103 is filled with the film 111 by the width a having an appropriate size.

The width b in the X direction of the space (corresponding to the size of two third spaces 103) enclosed with the two second sidewall film fringe portions 102 protruding in mutually opposite X directions and formed at the same position in the Y direction is greater than the width a of the third space 103 in the Y direction; and the entire space enclosed with the two second sidewall film fringe portions 102 is not completely filled with the film 111.

In other words, for the portion between the two third spaces 103 overlapping in the X direction, the film 111 is deposited onto the bottom portion without the space being completely filled.

Similarly for the spaces (the second space 104, the space between the second sidewall film fringe portions 102, the space between the outer side loop patterns 101a) having space widths that are greater than the width a of the third space 103, the film 111 is formed conformally without the film 111 being filled into the spaces.

Other than the silicon oxide film formed by plasma CVD method using silane as the source gas, a silicon oxide film formed by plasma CVD method using TEOS as a source gas, a carbon film formed by plasma CVD method, or a silicon nitride film formed by plasma CVD method can be used as the film 111 having different filling properties into the space dependent on the space widths such as those described above.

Then, etch-back of the film 111 is performed.

Figure 18B:
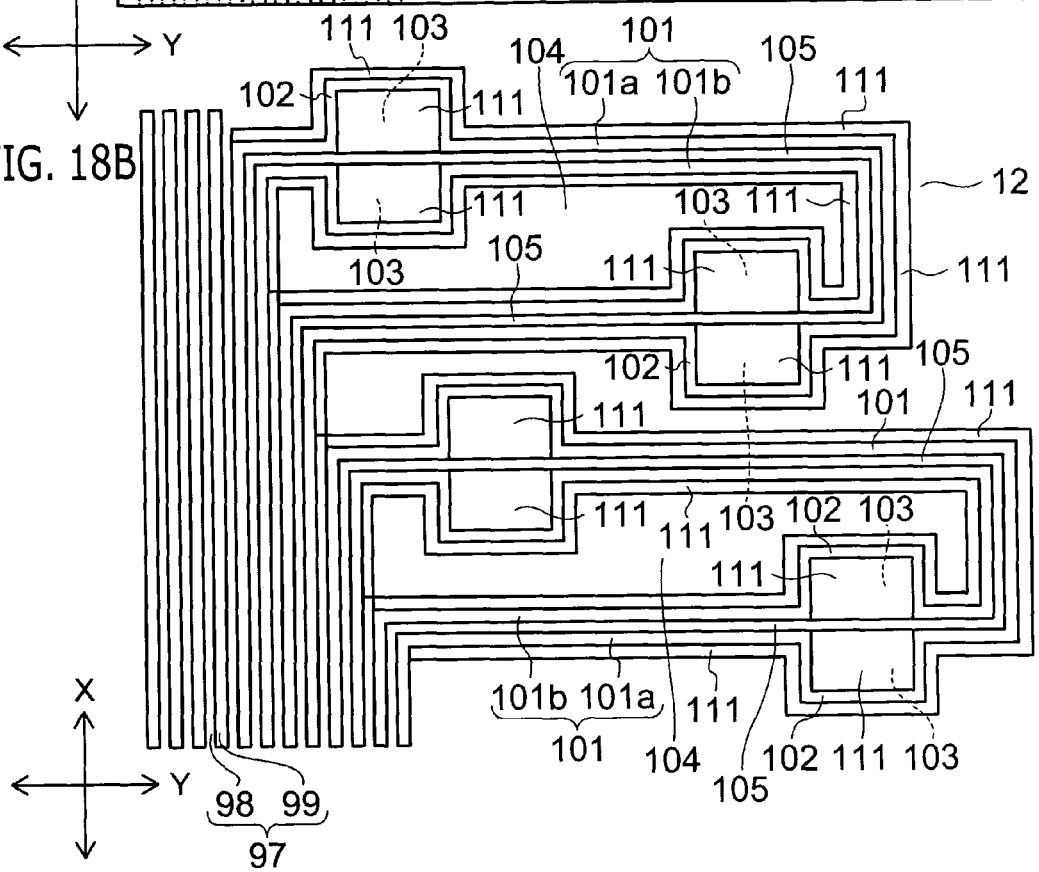

By the etch-back of the film 111 as shown in FIG. 18B, the film 111 on the second sidewall film line patterns 99, on the first space 98, on the second sidewall film loop patterns 101, and on the space 105 is removed. The state in which the first space 98 and the space 105 are not filled with the film 111 is maintained.

Although the film 111 on the third space 103 is removed by the etch-back of the film 111, the state in which the film 111 is filled into the third space 103 is maintained. In the region where two third spaces 103 are adjacent to each other in the X direction, the film 111 that was deposited onto the bottom portion between the third spaces 103 is removed. Accordingly, in the region where the two third spaces 103 are adjacent to each other in the X direction, the film 111 filled into each of the third spaces 103 is divided in the X direction.

The film 111 of the bottom portions of the spaces having widths greater than the width a of the third space 103 in the Y direction is removed; and for the spaces having the wide widths, the film 111 remains on the side walls of the second sidewall film line patterns 99, the side walls of the second sidewall film loop patterns 101, and the side walls of the second sidewall film fringe portions 102.

Then, the patterning film 12 is etched using the film 111 remaining on the patterning film 12, the second sidewall film line patterns 99, the second sidewall film loop patterns 101, and the second sidewall film fringe portions 102 as a mask.

Figure 19:
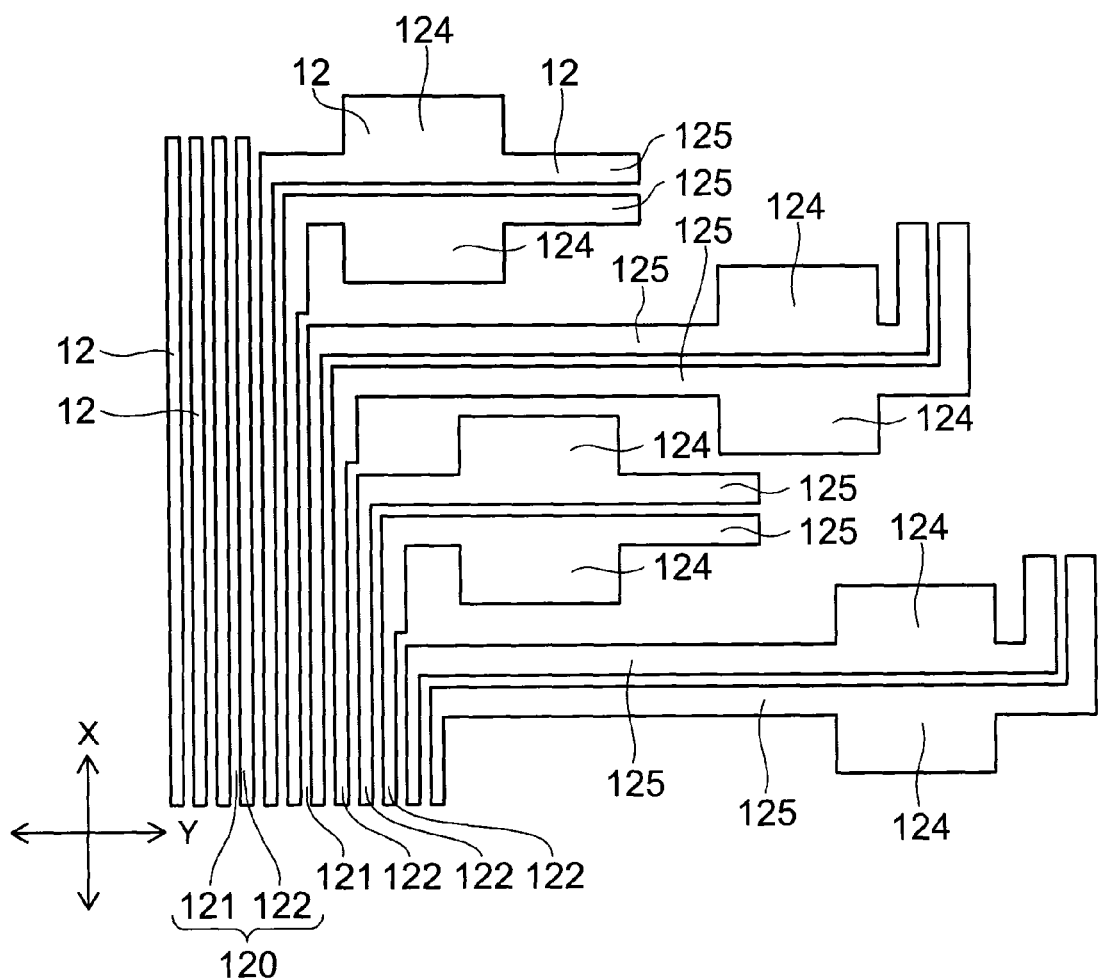

By etching as shown in FIG. 19, the patterning film 12 is patterned; and the loop portions are cut to divide the multiple contact fringe portions 124.

The pattern of the patterning film 12 includes a line-and-space pattern 120 arranged at a pitch that is narrower than the line-and-space pattern 71 of the resist film 14 shown in FIG. 14A limited by the resolution limit of the lithography.

By repeating the sidewall transfer process twice, in the second embodiment, the patterning film 12 can be patterned into the line-and-space pattern 120 that includes multiple line patterns 122 having widths about ¼ of the widths of the line patterns 72 of the resist film 14 and is arranged in the Y direction to be separated by a space 121. The pitch of the line-and-space pattern 120 is about ¼ of the pitch of the line-and-space pattern 71 of the resist film 14.

The pattern of the patterning film 12 includes the contact fringe portions 124 communicating with the end portions of the line patterns 122 and having widths greater than the widths of the line patterns 122. The contact fringe portions 124 communicate respectively with the end portions of the line patterns 122 extending in the X direction.

The X-direction widths and the Y-direction widths of the contact fringe portions 124 are greater than the widths of the line patterns 122. A not-shown via is provided on the contact fringe portion 124; and each of the line patterns 122 is electrically connected to an interconnect layer that functions as a bit line or a source line of the memory device by the via and the contact fringe portion 124.

According to the second embodiment described above, the contact fringe portions 124 for which a pattern size equal to or less than the resolution limit of the lithography is unnecessary also can be formed simultaneously while utilizing the sidewall transfer process to form the fine line-and-space pattern 120 equal to or less than the resolution limit of the lithography.

According to the second embodiment, in the process of removing the second sacrificial film 62, the lithography process of patterning the resist film covering the region where the contact fringe portions 124 are formed is unnecessary; and the manufacturing cost can be reduced.

The widths of portions 125 (shown in FIG. 19) where the patterning film 12 is patterned using the second sidewall film loop patterns 101 and the film 111 that remains on the side walls shown in FIG. 18B as a mask become wider than the line patterns 122 having the fine widths. Accordingly, for the contact fringe portions, it is also possible to use the broad portions 125 shown in FIG. 19 obtained by patterning by utilizing the film 111 that remains on the side walls of the second sidewall film loop patterns 101 in FIG. 18B without performing the process of forming the resist film 87 on the first sidewall film loop patterns 83 of FIG. 16A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:

stacking a first sacrificial film and a second sacrificial film above a patterning film, the second sacrificial film being of a layer under the first sacrificial film;

patterning the first sacrificial film into a plurality of first sacrificial film line patterns and a plurality of first sacrificial film fringe portions communicating with end portions of the first sacrificial film line patterns;

forming a first sidewall film on a side wall of each of the first sacrificial film line patterns and a side wall of each of the first sacrificial film fringe portions;

removing the first sacrificial film, causing the first sidewall film formed on the side wall of each of the first sacrificial film line patterns to remain above the second sacrificial film as a first sidewall film line pattern, and causing the first sidewall film formed on the side wall of each of the first sacrificial film fringe portions to remain above the second sacrificial film as a first sidewall film loop pattern;

patterning the second sacrificial film using at least the first sidewall film line pattern and the first sidewall film loop pattern as a mask to form a plurality of second sacrificial film line patterns and a plurality of second sacrificial film loop patterns communicating with end portions of the second sacrificial film line patterns;

forming a second sidewall film on a side wall of each of the second sacrificial film line patterns and a side wall of each of the second sacrificial film loop patterns;

removing the second sacrificial film, causing the second sidewall film formed on the side wall of each of the second sacrificial film line patterns to remain above the patterning film as a plurality of second sidewall film line patterns extending in a first direction and arranged to be separated by a first space, and causing the second sidewall film formed on the side wall of each of the second sacrificial film loop patterns to remain above the patterning film as a plurality of second sidewall film loop patterns communicating with end portions of the second sidewall film line patterns and arranged to be separated by a second space having a width greater than a width of the first space;

forming a film having different filling properties dependent on space width above the patterning film to cover the second sidewall film to form the film on the second sidewall film line patterns and on the first space while making a cavity in the first space and to form the film on at least a bottom portion of the second space and a side wall of each of the second sidewall film loop patterns;

performing etch-back of the film to remove the film on the second sidewall film line patterns and on the first space while causing the film to remain on at least the side wall of each of the second sidewall film loop patterns; and etching the patterning film using the remaining film and the second sidewall film as a mask.

2. The method for manufacturing the semiconductor device according to claim 1, further comprising covering the first sidewall film loop pattern selectively with a resist film after the removing of the first sacrificial film, the second sacrificial film being patterned using the first sidewall film line pattern, the first sidewall film loop pattern, and the resist film as a mask to form a plurality of second sacrificial film fringe portions selectively in the second sacrificial film loop patterns, the second sidewall film being formed also on a side wall of each of the second sacrificial film fringe portions, the second sidewall film formed on the side wall of each of the second sacrificial film fringe portions remaining above the patterning film as a plurality of second sidewall film fringe portions by the removing of the second sacrificial film, each of the second sidewall film fringe portions having a third space having a width greater than the width of the first space, the film having different filling properties being filled into the third space, the film filled into the third space being caused to remain by the etch-back of the film, and the patterning film is etched using the remaining film and the second sidewall film as the mask.

3. The method for manufacturing the semiconductor device according to claim 2, wherein each of the second sidewall film loop patterns includes:

an outer side loop pattern; and an inner side loop pattern formed on an inner side of the outer side loop pattern to be separated from the outer side loop pattern by a space having substantially the same width as the first space, two of the second sidewall film fringe portions protruding in mutually opposite directions communicate with one outer side loop pattern, and two of the second sidewall film fringe portions protruding in mutually opposite directions communicate with one inner side loop pattern.

4. The method for manufacturing the semiconductor device according to claim 2, wherein each of the second sidewall film loop patterns includes:

an outer side loop pattern; and an inner side loop pattern formed on an inner side of the outer side loop pattern to be separated from the outer side loop pattern by a space having substantially the same width as the first space, two of the second sidewall film fringe portions protruding in mutually opposite directions are formed on an inner side of the inner side loop pattern, positions of the two of the second sidewall film fringe portions being shifted in a second direction orthogonal to the first direction, and two of the second sidewall film fringe portions protruding in mutually opposite directions are formed between mutually-adjacent outer side loop patterns, positions of the two of the second sidewall film fringe portions being shifted in the second direction.

5. The method for manufacturing the semiconductor device according to claim 1, further comprising slimming the first sacrificial film line patterns prior to the forming of the first sidewall film.

6. The method for manufacturing the semiconductor device according to claim 1, further comprising slimming the second sacrificial film line patterns prior to the forming of the second sidewall film.

7. The method for manufacturing the semiconductor device according to claim 1, wherein each of the second sidewall film loop patterns includes:

an outer side loop pattern; and an inner side loop pattern formed on an inner side of the outer side loop pattern to be separated from the outer side loop pattern by a space having substantially the same width as the first space, and the second space is made on an inner side of the inner side loop pattern.

8. The method for manufacturing the semiconductor device according to claim 7, wherein a fourth space is made between mutually-adjacent outer side loop patterns, the fourth space having a width greater than the width of the first space.

9. The method for manufacturing the semiconductor device according to claim 1, wherein a silicon oxide film is formed as the film having different filling properties by plasma CVD (chemical vapor deposition) method using silane as a source gas.

* * * * *